US011990663B2

(12) United States Patent
Sartorio et al.

(10) Patent No.: US 11,990,663 B2
(45) Date of Patent: May 21, 2024

(54) ROTARY RADIO FREQUENCY SWITCHES

(71) Applicant: CommScope Italy S.R.L., Agrate Brianza (IT)

(72) Inventors: Alessandro Sartorio, Sovico (IT); Daniele Marrelli, Carnate (IT); Giuseppe Resnati, Seregno (IT); Roman Tkadlec, Valasske Klobouky (CZ)

(73) Assignee: CommScope Italy S.R.L. (IT)

( * ) Notice: Subject to any disclaimer, the term of this patent is extended or adjusted under 35 U.S.C. 154(b) by 12 days.

(21) Appl. No.: 17/583,804

(22) Filed: Jan. 25, 2022

(65) Prior Publication Data

US 2022/0320702 A1 Oct. 6, 2022

(30) Foreign Application Priority Data

Apr. 1, 2021 (IT) .......................... 102021000008195

(51) Int. Cl.
*H01P 5/16* (2006.01)
*H01P 1/06* (2006.01)
*H03H 11/04* (2006.01)

(52) U.S. Cl.
CPC ................ *H01P 5/16* (2013.01); *H01P 1/062* (2013.01); *H03H 11/04* (2013.01)

(58) Field of Classification Search
CPC ............ H01P 5/16; H01P 1/062; H03H 11/04
USPC ........................................................ 333/259
See application file for complete search history.

(56) References Cited

U.S. PATENT DOCUMENTS

| 3,530,504 A * | 9/1970 | Konishi ................. H01P 1/125 |
| | | 333/108 |
| 3,969,690 A | 7/1976 | Hansen et al. |
| 10,522,888 B2 * | 12/2019 | Ernst ...................... H01P 1/125 |
| 2009/0277762 A1 | 11/2009 | Nakatsuka et al. |
| 2012/0013425 A1 | 1/2012 | Tor et al. |
| 2017/0324133 A1 | 11/2017 | Grassl et al. |
| 2018/0337443 A1 | 11/2018 | Bisiules et al. |

FOREIGN PATENT DOCUMENTS

| GB | 2187599 A | 9/1987 | |
| GB | 2368470 A * | 5/2002 | .............. H01P 1/068 |
| WO | 2011145271 A1 | 11/2011 | |
| WO | 2017165512 A1 | 9/2017 | |
| WO | 2021231249 A1 | 11/2021 | |

OTHER PUBLICATIONS

Italian Search Report corresponding to Italian Patent Application No. 102021000025433 (15 pages) (May 20, 2022).
Italian Search Report corresponding to Italian Patent Application No. 102021000008195 (21 pages) (Dec. 1, 2021).

* cited by examiner

*Primary Examiner* — Daniel C Puentes
(74) *Attorney, Agent, or Firm* — Myers Bigel, P.A.

(57) ABSTRACT

Radio frequency (RF) switches are provided. An RF switch includes a first RF transmission line and a second RF transmission line that are capacitively coupled to each other. Moreover, the RF switch includes a third RF transmission line having a signal trace that is electrically isolated from the first and second RF transmission lines. Related methods of operating filter devices are also provided.

15 Claims, 23 Drawing Sheets

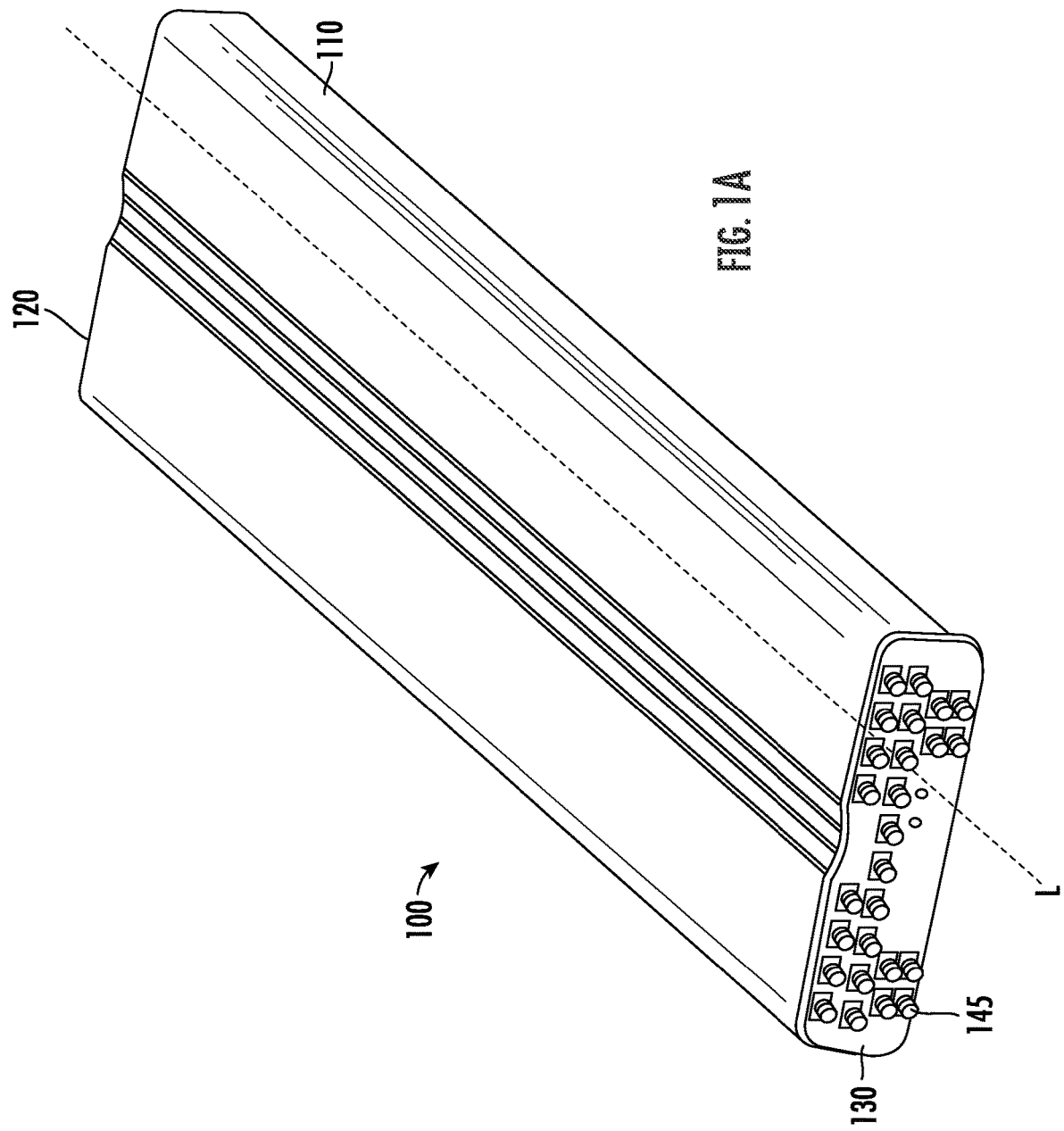

ROTARY RADIO FREQUENCY SWITCHES

CROSS-REFERENCE TO RELATED APPLICATIONS

The present application claims priority to Italian Patent Application Nos. 102021000008195, filed Apr. 1, 2021, and 102021000025433, filed Oct. 6, 2021, the entire content of each of which is incorporated herein by reference.

FIELD

The present disclosure relates to communications systems and, in particular, to radio frequency ("RF") switches that are usable, for example, with RF filters.

BACKGROUND

Base station antennas for wireless communications systems are used to provide cellular communications service to fixed and mobile users that are within defined coverage areas of the respective base station antennas. These base station antennas typically include one or more linear arrays or two-dimensional arrays of radiating elements, such as dipole, or crossed-dipole, radiating elements that act as individual antenna elements. Each of these arrays may be connected to one or more RF ports. The RF ports are used to pass RF signals between the arrays and one or more radios.

Example base station antennas are discussed in International Publication No. WO 2017/165512 to Bisiules, U.S. patent application Ser. No. 15/921,694 to Bisiules et al., and U.S. Patent Application No. 63/024,846 to Hamdy et al., the disclosures of which are hereby incorporated herein by reference in their entireties. Though it may be advantageous for a base station antenna to use an RF filter for a particular application of the antenna, use of the filter may be undesirable for another application (e.g., a different mode) of the antenna.

SUMMARY

An RF switch, according to some embodiments, may include a first RF transmission line and a second RF transmission line that are capacitively coupled to each other. Moreover, the RF switch may include a third RF transmission line having a signal trace that is electrically isolated from the first and second RF transmission lines.

In some embodiments, the RF switch may include a movable metal line that is configured to provide the capacitive coupling between the first and second RF transmission lines. Moreover, the RF switch may include a conductive rod that is coupled to ground. The conductive rod may define a rotational axis of the RF switch, may be between the signal trace of the third RF transmission line and the first and second RF transmission lines, and/or may protrude from a surface of a conductive housing.

An RF switch, according to some embodiments, may include first, second, and third RF transmission lines. The RF switch may include a movable metal line that is configured to move from a first position at which the movable metal line couples the first and second RF transmission lines to each other to a second position at which the movable metal line couples the second and third RF transmission lines to each other. The movable metal line may include first and second coupling sections that overlap the first and second RF transmission lines, respectively, when the movable metal line is at the first position. Moreover, the first and second coupling sections may overlap the second and third RF transmission lines, respectively, when the movable metal line is at the second position.

In some embodiments, the first and second coupling sections of the movable metal line may be configured to simultaneously move in a clockwise or counterclockwise direction. For example, the first and second coupling sections of the movable metal line may be configured to revolve around a rotational axis of the RF switch. Each of the first, second, and third RF transmission lines, on the other hand, may be a stationary RF transmission line that does not revolve around the rotational axis of the RF switch.

According to some embodiments, the RF switch may include a conductive rod that is coupled to ground and that defines the rotational axis of the RF switch. A signal trace of the third RF transmission line may be electrically isolated from the first and second RF transmission lines when the movable metal line is at the first position. Moreover, a signal trace of the first RF transmission line may be electrically isolated from the second and third RF transmission lines when the movable metal line is at the second position.

In some embodiments, the RF switch may include a rotary plastic body that is configured to rotate around the conductive rod. The rotary plastic body may be contactless.

According to some embodiments, the movable metal line may be on a lower surface of the rotary plastic body. Moreover, the rotary plastic body may overlap each of the first, second, and third RF transmission lines.

In some embodiments, the movable metal line may be on a curved side surface of the rotary plastic body that faces a respective vertically-protruding portion of each of the first, second, and third RF transmission lines.

According to some embodiments, the conductive rod may be spaced apart from the signal trace of the third RF transmission line, the signal trace of the first RF transmission line, and a signal trace of the second RF transmission line.

In some embodiments, the RF switch may be coupled to a filter device and may be configured to switch between first and second filtering-response modes of the filter device by moving the movable metal line between the first position and the second position.

An RF switch, according to some embodiments, may include first, second, and third RF transmission lines. The RF switch may include a movable metal line that is configured to move from a first position at which the movable metal line couples the first and second RF transmission lines to each other to a second position at which the movable metal line couples the second and third RF transmission lines to each other. Moreover, the RF switch may include a conductive rod that is coupled to ground and is between and spaced apart from respective signal traces of the first, second, and third RF transmission lines.

In some embodiments, the signal trace of the third RF transmission line may be electrically isolated from the signal traces of the first and second RF transmission lines, respectively, when the movable metal line is at the first position. Moreover, the signal trace of the first RF transmission line may be electrically isolated from the signal traces of the second and third RF transmission lines, respectively, when the movable metal line is at the second position.

A method of operating a filter device of a base station antenna, according to some embodiments, may include switching between first and second filtering-response modes of the filter device by moving a metal line between a first position at which the metal line couples first and second RF transmission lines of an RF switch to each other and a second position at which the metal line couples the second RF transmission line and a third RF transmission line of the RF switch to each other, while a conductive rod provides a grounded isolation wall between signal traces of the first, second, and third RF transmission lines, respectively.

In some embodiments, the RF switch may include a plastic body that is on the conductive rod. The metal line may be on the plastic body. Moreover, moving the metal line may include rotating the plastic body around the conductive rod relative to each of the first, second, and third RF transmission lines.

According to some embodiments, moving the metal line may include simultaneously moving first and second coupling sections of the metal line in a clockwise or counter-clockwise direction. For example, the first and second coupling sections of the metal line may revolve around a rotational axis of the RF switch, which may be defined by the conductive rod. Moreover, each of the first, second, and third RF transmission lines may be a stationary RF transmission line that does not revolve around the rotational axis of the RF switch, and the coupling of the first and second RF transmission lines to each other at the first position of the metal line and the coupling of the second and third RF transmission lines to each other at the second position of the metal line may each include capacitive coupling.

BRIEF DESCRIPTION OF THE DRAWINGS

FIG. 1A is a front perspective view of a base station antenna, according to embodiments of the present invention.

DETAILED DESCRIPTION

Figure 1B:
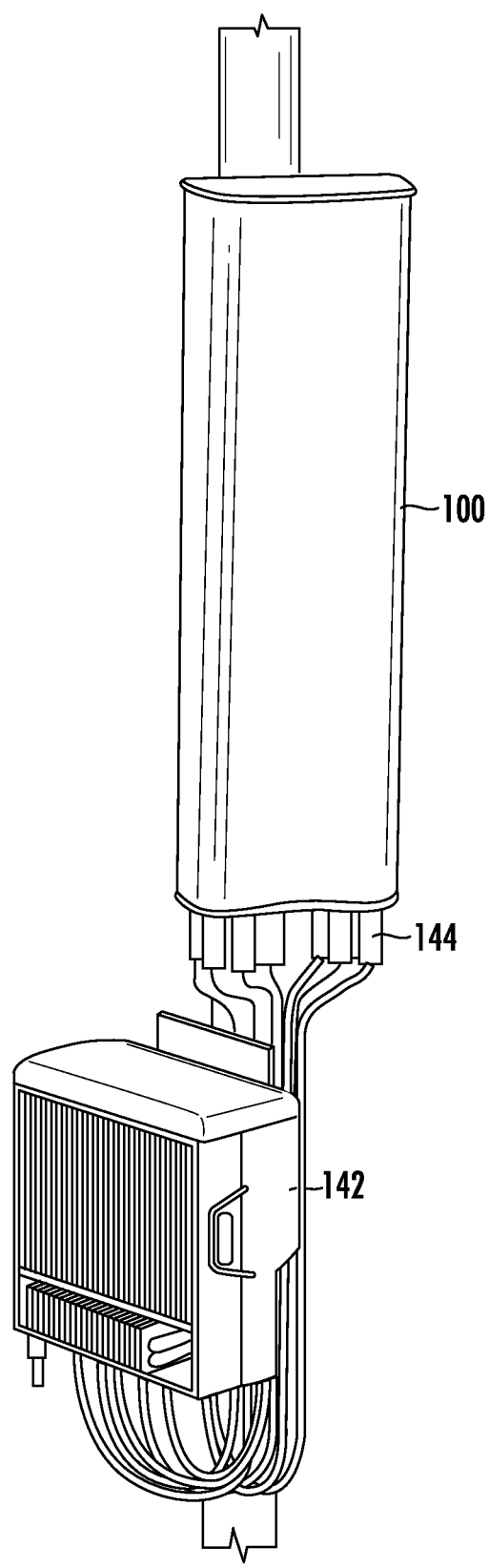
FIG. 1B is a front perspective view of the base station antenna of FIG. 1A electrically connected to a radio.

Pursuant to embodiments of the present invention, rotary RF switches are provided that allow two RF transmission lines (e.g., serving as respective RF ports of a switch) to be coupled to each other. Specifically, the two transmission lines may be capacitively coupled to each other, thus providing an RF path having reduced insertion losses, reduced passive intermodulation ("PIM") distortion, and reduced arcing relative to a conventional RF electromechanical relay/switch (or other galvanic connection). A third RF transmission line (e.g., serving as a third port) of the switch may be electrically isolated from the two transmission lines by at least a predetermined amount (e.g., 35 decibels ("dB")). By rotating the switch, any two of the three transmission lines may be capacitively coupled to each other while leaving the third transmission line sufficiently isolated. The capacitive coupling of the switch inherently acts as a direct current ("DC") block, thus obviating the need for a separate DC block. Moreover, the switch may have a non-printed circuit board ("PCB") design that is easily connected to RF components (e.g., RF transmission lines, RF connectors/ports, and/or resonators) of an RF filter device.

It may be desirable to provide two or more different filtering responses for an RF filter device that is integrated into a base station antenna or that is external to the antenna and interposed along RF paths between radio(s) and the antenna. In particular, having the flexibility to switch (e.g., remotely switch) between different filtering responses as new frequencies become available for use over time can be valuable. For example, frequencies that are initially used for satellite applications may later become available for cellular base station antenna applications.

One conventional technique for switching between different filters is to perform the switching manually while a base station (e.g., at least one radio thereof) is powered off. Specifically, a technician can climb an antenna tower and manually swap an old filter with a new filter that is adapted for new frequencies. Remote switching, by contrast, can eliminate difficult manual work and may require little or no time for the base station to be powered off. Remote switching can thus reduce the cost of deploying a new filtering response for new frequencies.

Some conventional remote switching techniques, however, such as the use of electromechanical switches, may not be ideal for base station antenna applications. For example, though electromechanical switches may be used to switch between different filters of a filter bank, such electromechanical switches are typically high-power rated switches that are expensive and bulky. Moreover, electromechanical switches may introduce additional insertion losses and may not be suitable for applications requiring low PIM distortion.

According to the present invention, however, a rotary body of an RF switch can rotate about an axis thereof to change (i) which two RF transmission lines of the switch are capacitively (rather than galvanically) coupled to each other and (ii) which third RF transmission line of the switch is grounded and electrically isolated from the two coupled transmission lines. Specifically, a filtering response of an RF filter can be changed by moving a conductive (e.g., metal) line that is inside the rotary body and that capacitively couples two transmission lines to each other, while grounding a third transmission line by moving at least one electrical contact that is inside the rotary body. Grounding the third transmission line can provide good isolation from the two coupled transmission lines.

Example embodiments of the present invention will be described in greater detail with reference to the attached figures.

FIG. 1A is a front perspective view of a base station antenna 100, according to embodiments of the present invention. The antenna 100 may be, for example, a cellular base station antenna at a macrocell base station or at a small cell base station. As shown in FIG. 1A, the antenna 100 is an elongated structure and has a generally rectangular shape. The antenna 100 includes a radome 110. In some embodiments, the antenna 100 further includes a top end cap 120 and/or a bottom end cap 130. The bottom end cap 130 may include a plurality of RF connectors 145 mounted therein. The connectors 145, which may also be referred to herein as "ports," are not limited, however, to being located on the bottom end cap 130. Rather, one or more of the connectors 145 may be provided on, for example, the rear (i.e., back) side of the radome 110 that is opposite the front side of the radome 110. The antenna 100 is typically mounted in a vertical configuration (i.e., the long side of the antenna 100 extends along a vertical axis L with respect to Earth).

FIG. 1B is a front perspective view of the base station antenna 100 electrically connected to a radio 142 by RF transmission lines 144, such as coaxial cables. For example, the radio 142 may be a cellular base station radio, and the antenna 100 and the radio 142 may be located at (e.g., may be components of) a cellular base station.

Figure 1C:
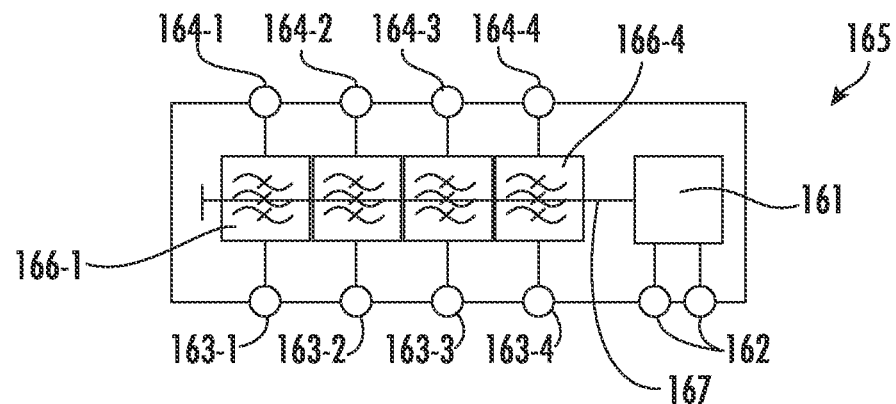
FIGS. 1C and 1D are schematic block diagrams of four-filter and eight-filter RF filter devices, respectively, according to embodiments of the present invention.
Figure 1D:
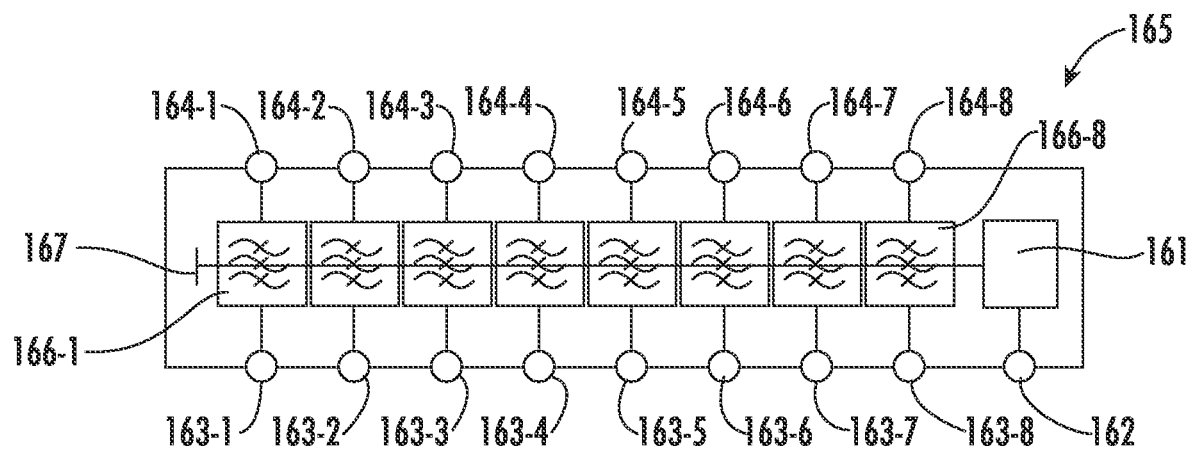

FIGS. 1C and 1D are schematic block diagrams of four-filter and eight-filter RF filter devices 165, respectively, according to embodiments of the present invention. The filter device 165 of FIG. 1C includes four RF filters 166-1 through 166-4 that can be coupled to a 4T4R radio, whereas the filter device 165 of FIG. 1D includes eight RF filters 166-1 through 166-8 that can be coupled to an 8T8R radio. Each filter 166 is coupled between a respective pair of RF ports 163 and 164 of the filter device 165. As an example, the filter 166-1 is coupled between a port 163-1 and a port 164-1. The ports 163 may be coupled to, for example, to ports of a radio 142 (FIG. 1B), and the ports 164 may be coupled to arrays 170 (FIG. 1E) of radiating elements 271 (FIG. 2) of a base station antenna 100 (FIG. 1A).

In some embodiments, the ports 163 may be RF signal input ports that provide downlink RF signals from the radio 142 to the filters 166, and the ports 164 may be RF signal output ports that provide filtered downlink RF signals that are output from the filters 166 to radiating elements 271 (FIG. 2) of the antenna 100. The ports 163 and the ports 164 may not be limited, however, to inputting and outputting, respectively, downlink RF signals. Rather, the ports 164 may serve as RF signal input ports that provide uplink RF signals from the radiating elements 271 to the filters 166, and the ports 163 may likewise serve as RF signal output ports that provide filtered uplink RF signals that are output from the filters 166 to the radio 142. Accordingly, the ports 163 and the ports 164 may be respective bidirectional ports that are coupled to the radio 142 and the arrays 170, respectively.

Each filter device 165 also includes an actuator 161 that is configured to rotate one or more RF switches 300 (FIG. 3) of the filters 166 about a respective rotational axis RA (FIG. 4B) of each switch 300, such as by moving a dielectric rod (or shaft) 167 that is physically connected (e.g., attached) to each switch 300. In some embodiments, each filter 166 may be coupled to a respective pair of switches 300, such as one switch 300 coupled to an input of the filter 166 and another switch 300 coupled to an output of the filter 166. The actuator 161 may be, for example, a solenoid or an electric motor. Moreover, the actuator 161 may be a remotely-controllable actuator, and thus may include one or more control ports 162 that provide control signals to the actuator 161. In some embodiments, a plurality of filter devices 165 may be daisy-chained with each other by connecting an output port 162 of a first actuator 161 of a first filter device 165 to an input port 162 of a second actuator 161 of a second filter device 165.

The filter device 165 may be a pole-mountable or wall-mountable outdoor unit that has a relatively small size and weight. For example, even if the filter device 165 includes eight filters 166, the filter device 165 may weigh less than 10 kilograms and have dimensions of no more than 270 millimeters ("mm") in length by 150 mm in width by 90 mm in height. As an example, the dimensions may be no more than 180 mm by 80 mm by 70 mm. If the filter device 165 has only four filters 166, then the dimensions may be no more than 270 mm by 150 mm by 45 mm, or even no more than 180 mm by 80 mm by 40 mm. The filter device 165 may be configured to handle at least 40 Watts of RF power. In some embodiments, the filter device 165 may be mounted within a base station antenna.

Figure 1E:
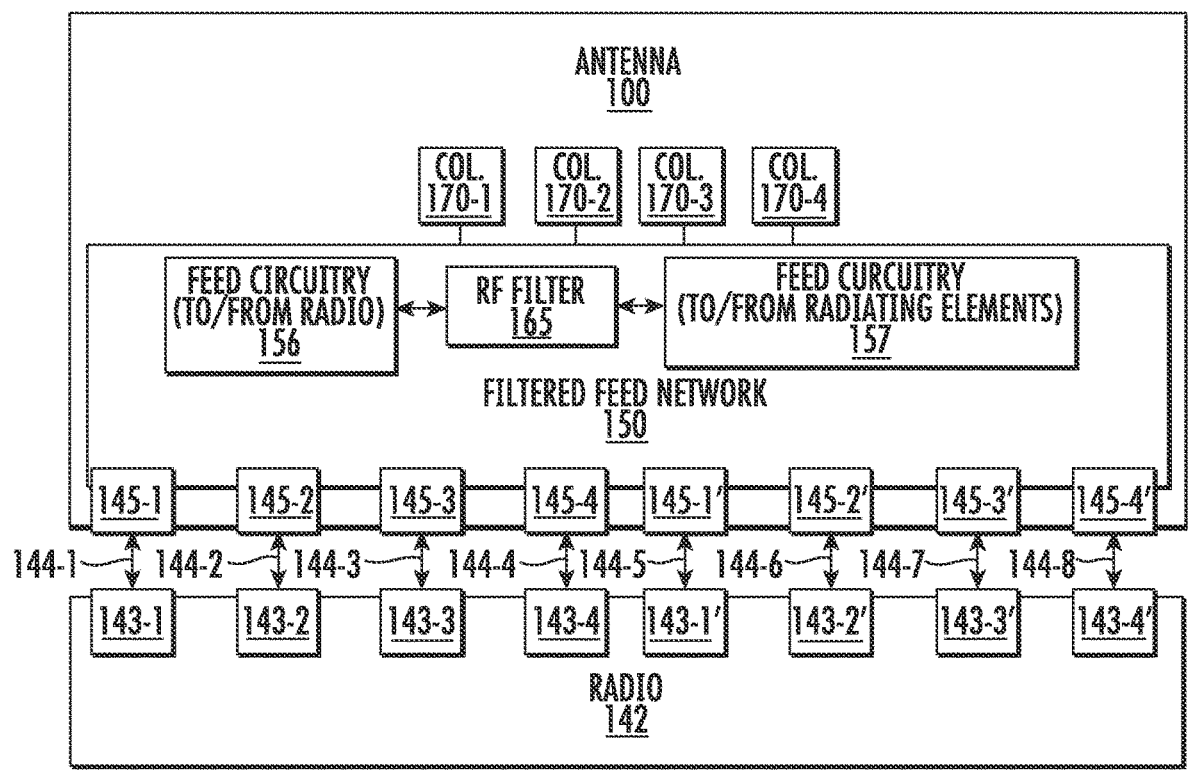
FIG. 1E is a schematic block diagram of ports of the base station antenna of FIG. 1A electrically connected to ports of the radio of FIG. 1B.

FIG. 1E is a schematic block diagram of ports 145 of the base station antenna 100 electrically connected to respective ports 143 of the radio 142. As shown in FIG. 1E, ports 145-1 through 145-4 of the antenna 100 are electrically connected to ports 143-1 through 143-4, respectively, of the radio 142 by respective RF transmission lines 144-1 through 144-4, such as coaxial cables. Similarly, ports 145-1' through 145-4' of the antenna 100 are electrically connected to ports 143-1' through 143-4', respectively, of the radio 142 by respective RF transmission lines 144-5 through 144-8. The ports 145-1 through 145-4 may transmit and/or receive RF signals in the same frequency band as the ports 145-1' through 145-4', or in a different frequency band from the ports 145-1' through 145-4'. For simplicity of illustration, only eight ports 145 are shown in FIG. 1E. In some embodiments, however, the antenna 100 may include twelve, twenty, thirty, or more ports 145. Moreover, though all of the ports 143 are shown as being part of a single radio 142, it will be appreciated that the ports 143 may alternatively be spread across multiple radios 142.

The antenna 100 may transmit and/or receive RF signals in one or more frequency bands, such as one or more bands comprising frequencies between 3,550 megahertz ("MHz") and 4,200 MHz. For example, the antenna 100 may transmit and/or receive RF signals in three or more different bands, including a first band comprising frequencies between 3,550

MHz and 3,700 MHz, a second band comprising frequencies between 3,700 MHz and 4,000 MHz, and a third band comprising frequencies between 4,000 MHz and 4,200 MHz. Moreover, the antenna 100 may, in some embodiments, transmit and/or receive RF signals in a portion of one of those bands, such as a first portion comprising frequencies between 3,700 MHz and 3,800 MHz, while rejecting RF signals in another portion, such as a second portion comprising frequencies between 3,820 MHz and 3,980 MHz.

The antenna 100 may include arrays (e.g., vertical columns) 170-1 through 170-4 of radiating elements 271 (FIG. 2) that are configured to transmit and/or receive RF signals. The antenna 100 may also include a filtered feed network 150 that is coupled between the arrays 170 and the radio 142. For example, the arrays 170 may be coupled to respective RF transmission paths (e.g., including one or more RF transmission lines) of the feed network 150.

In some embodiments, the feed network 150 may include one or more RF filter devices 165. Feed circuitry 156 of the feed network 150 may be coupled between each filter device 165 and the radio 142. In other embodiments, the filter device(s) 165 may be external to the antenna 100. As an example, a standalone unit that is coupled between the radio 142 and the antenna 100 may comprise the filter device(s) 165.

The feed network 150 may also include feed circuitry 157 that is coupled between the filter device(s) 165 and the arrays 170. The circuitry 156/157 can couple downlink RF signals from the radio 142 to radiating elements 271 that are in arrays 170. The circuitry 156/157 may also couple uplink RF signals from radiating elements 271 that are in arrays 170 to the radio 142. For example, the circuitry 156/157 may include power dividers, RF switches, RF couplers, and/or RF transmission lines that couple the filter device(s) 165 between the radio 142 and the arrays 170.

Moreover, the antenna 100 may include phase shifters that are used to electronically adjust the tilt angle of the antenna beams generated by each array 170. The phase shifters may be located at any appropriate location along the RF transmission paths that extend between the ports 145 and the arrays 170. Accordingly, though omitted from view in FIG. 1E for simplicity of illustration, the feed network 150 may include phase shifters.

Figure 2:
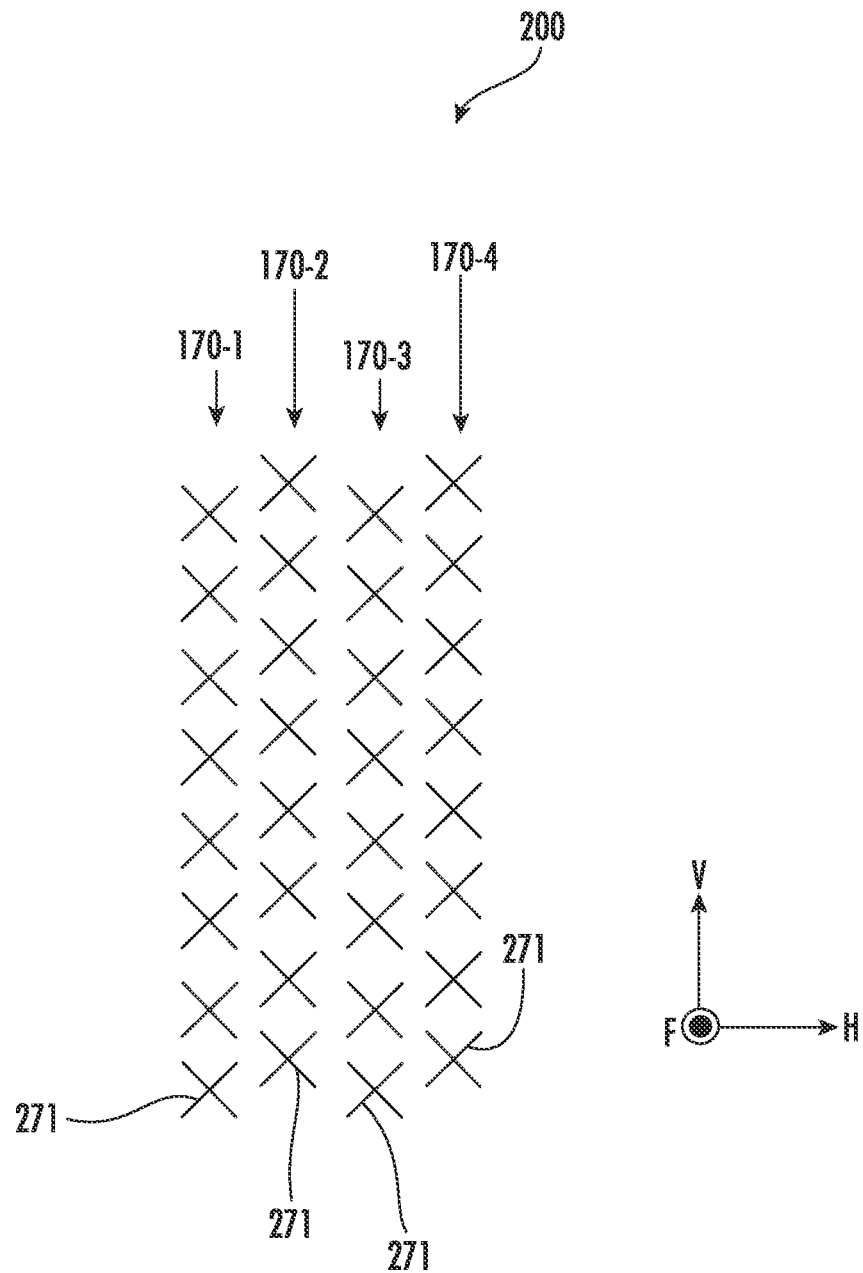
FIG. 2 is an example schematic front view of the base station antenna of FIG. 1A with the radome removed.

FIG. 2 is an example schematic front view of the base station antenna 100 of FIG. 1A with the radome 110 thereof removed to illustrate an antenna assembly of the antenna 100. The antenna assembly includes a plurality of radiating elements 271, which may be grouped into one or more arrays 170.

For example, FIG. 2 shows an antenna assembly 200 including four arrays 170-1 through 170-4 of radiating elements 271 in four vertical columns, respectively, that are spaced apart from each other in a horizontal direction H. Vertical columns of radiating elements 271 may extend in a vertical direction V from a lower portion of the antenna assembly 200 to an upper portion of the antenna assembly 200. The vertical direction V may be, or may be parallel with, the longitudinal axis L (FIG. 1A). The vertical direction V may also be perpendicular to the horizontal direction H and a forward direction F. As used herein, the term "vertical" does not necessarily require that something is exactly vertical (e.g., the antenna 100 may have a small mechanical down-tilt). For simplicity of illustration, the feed circuitry 157 (FIG. 1E) that is coupled to the antenna assembly 200 is omitted from view in FIG. 2.

The arrays 170 are each configured to transmit and/or receive RF signals in one or more frequency bands, such as one or more bands comprising frequencies between 3,550 MHz and 4,200 MHz. Though FIG. 2 illustrates four arrays 170-1 through 170-4, the antenna assembly 200 may include more (e.g., five, six, or more) or fewer (e.g., three, two, or one) arrays 170. Moreover, the number of radiating elements 271 in an array 170 can be any quantity from two to twenty or more. For example, the four arrays 170-1 through 170-4 shown in FIG. 2 may each have five to twenty radiating elements 271. In some embodiments, the arrays 170 may each have the same number (e.g., eight) of radiating elements 271.

Figure 3:
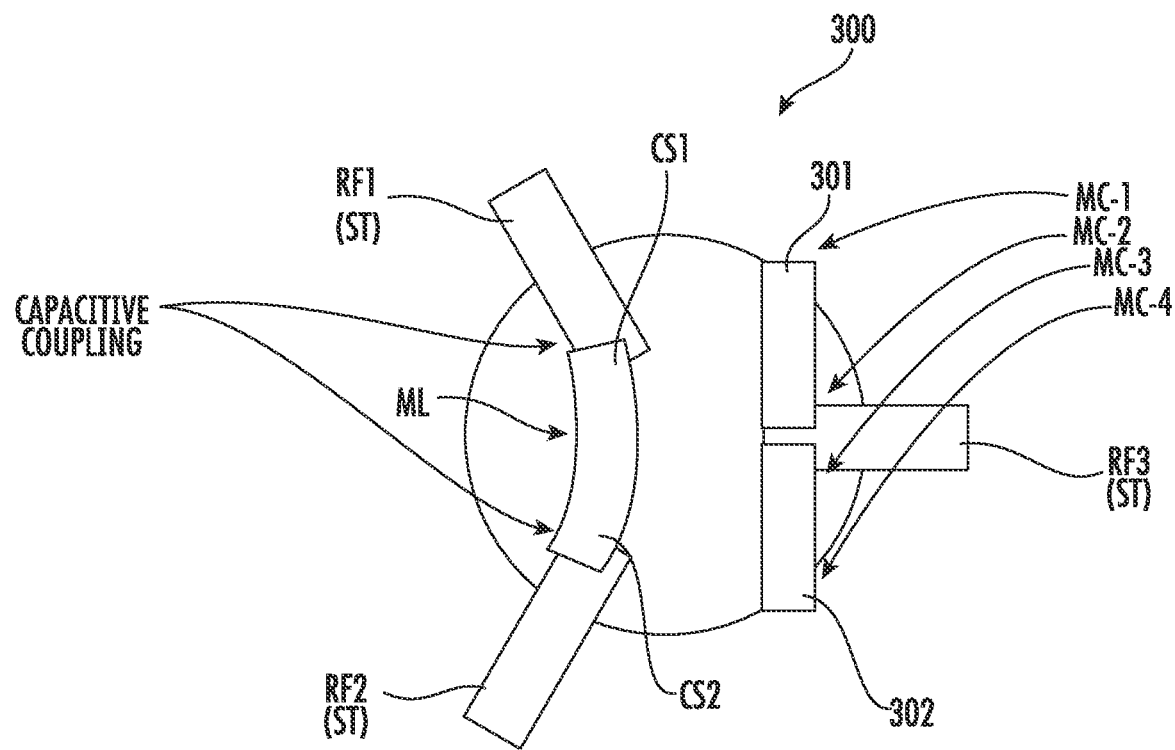
FIG. 3 is a top schematic view of the inside of an RF switch, according to embodiments of the present invention.

FIG. 3 is a top schematic view of the inside of an RF switch 300, according to embodiments of the present invention. The switch 300 may be a three-port switch having first to third RF transmission lines RF1-RF3. The switch 300 includes a movable metal line ML that is configured to capacitively couple a pair of the transmission lines RF1-RF3 to each other. For example, as shown in FIG. 3, the metal line ML has first and second coupling sections CS1, CS2 that are capacitively coupled to the first and second transmission lines RF1, RF2, respectively, when the metal line ML is at a first position relative to the transmission lines RF1-RF3.

The first position of the metal line ML may correspond to a first filtering-response mode of an RF filter device 165 (FIGS. 1C and 1D). A second position of the metal line ML may likewise correspond to a second filtering-response mode of the filter device 165. Switching from the first position to the second position comprises displacing each of the first and second coupling sections CS1, CS2 of the metal line ML to change the respective transmission lines to which the first and second coupling sections CS1, CS2 are capacitively coupled. Accordingly, the entire metal line ML (including both coupling sections CS1, CS2) can be displaced, rather than merely pivoting the metal line ML at one point thereof.

FIG. 3 further illustrates that the switch 300 includes a plurality of movable contacts MC. For example, the switch 300 may have spaced-apart first and second movable metal pieces 301, 302, each of which may include a pair of contacts MC. As shown in FIG. 3, a first contact MC-1 of the metal piece 301 and a fourth contact MC-4 of the metal piece 302 may not overlap any of the transmission lines RF1-RF3 when the metal line ML capacitively couples the first and second transmission lines RF1, RF2 to each other. Rather, the first and fourth contacts MC-1, MC-4 may both physically contact a ground connection. For example, the first and fourth contacts MC-1, MC-4 may each downwardly protrude toward a body 710 (FIG. 7A) of the filter device 165. In some embodiments, the first and fourth contacts MC-1, MC-4 can physically contact the body 710 (or a ground connection stamped thereon) simultaneously with each other.

Moreover, a second contact MC-2 of the metal piece 301 and a third contact MC-3 of the metal piece 302 may vertically overlap the third transmission line RF3. For example, the second and third contacts MC-2, MC-3 may downwardly protrude toward and, in some embodiments, physically contact a signal trace ST of the third transmission line RF3. As a result, the metal pieces 301, 302 can couple the signal trace ST of the third transmission line RF3 to ground (via the first and fourth contacts MC-1, MC-4) while the third transmission line RF3 is electrically isolated from the first and second transmission lines RF1, RF2.

Figure 6A:
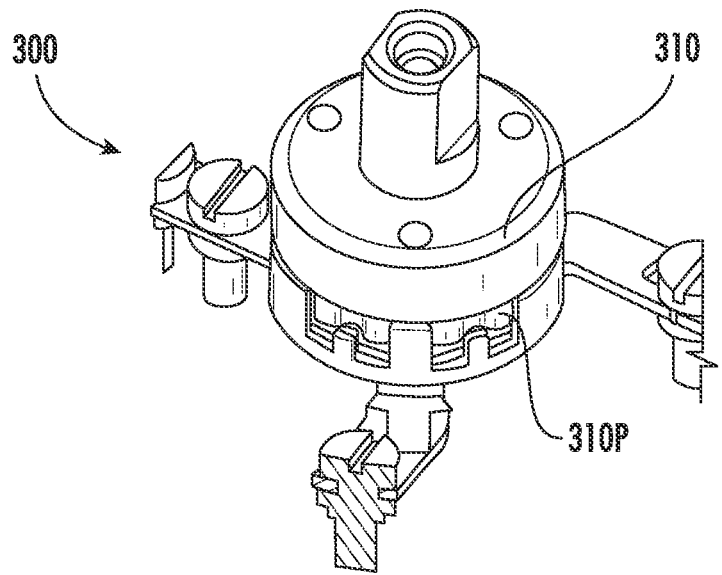
FIG. 6A is a top perspective view of the RF switch of FIG. 3.
Figure 6B:
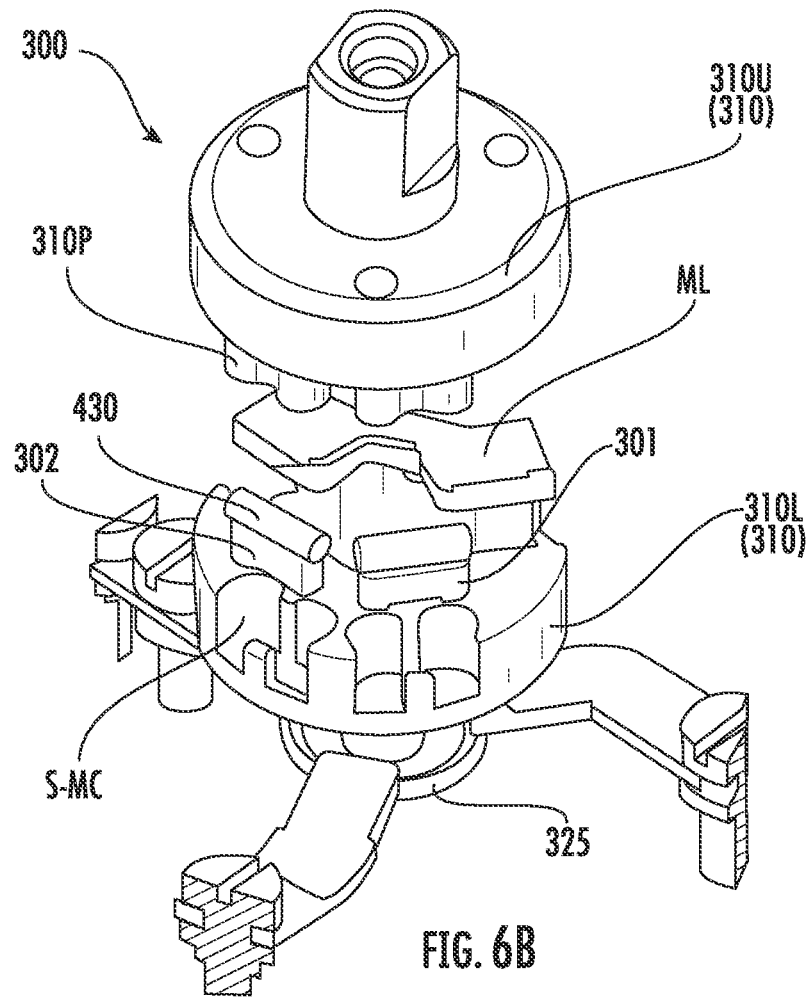
FIG. 6B is an exploded top perspective view of the RF switch of FIG. 6A.
Figure 6C:
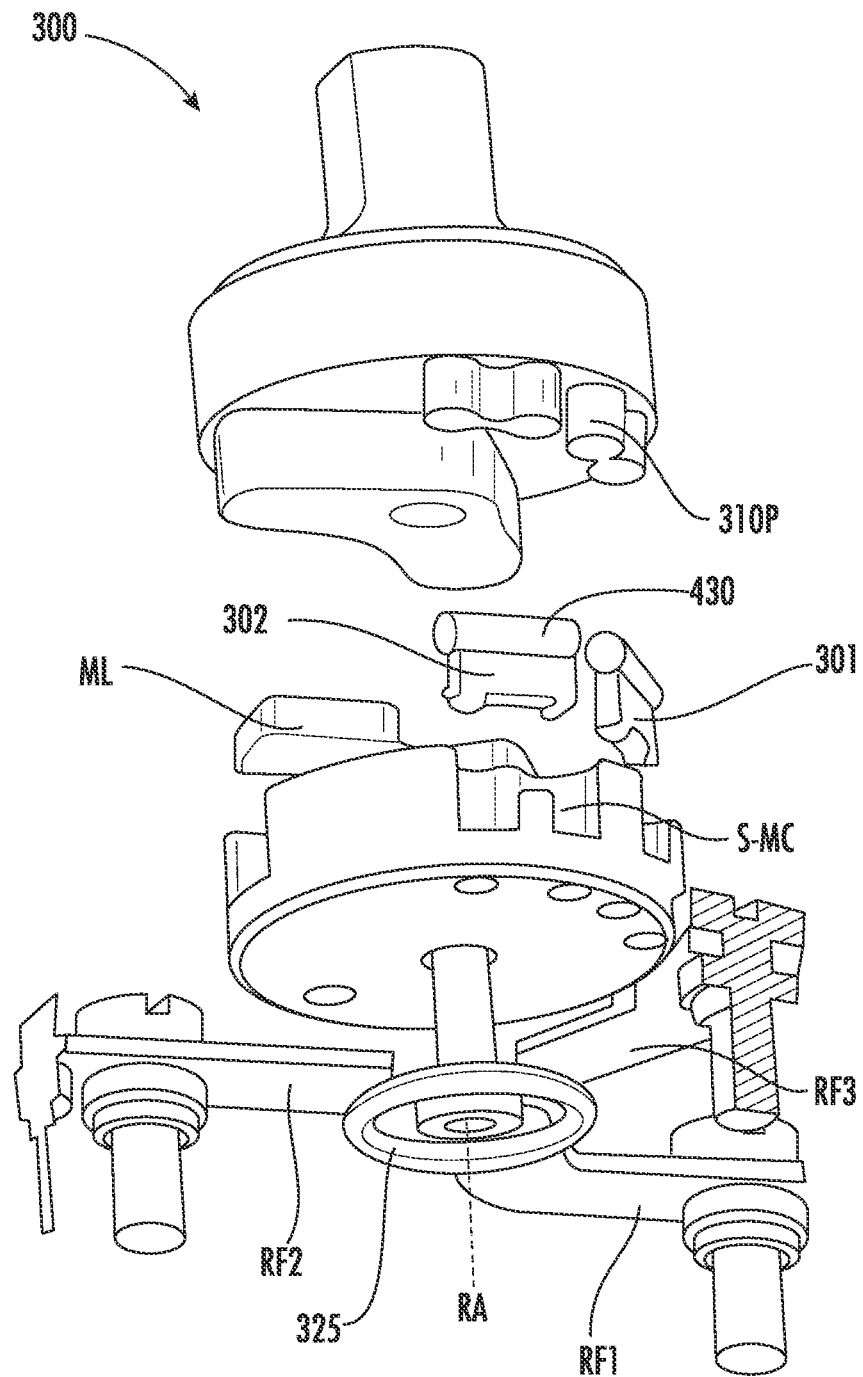
FIG. 6C is an exploded side perspective view of the RF switch of FIG. 6A.

The contacts MC and the metal line ML may be in the same rotary body 310 (FIG. 6B), and thus may be configured to move simultaneously with each other when the housing 310 rotates about its rotational axis RA (FIG. 6C). Accordingly, movement of the metal line ML from its first position to its second position will occur concurrently with movement of the metal pieces 301, 302 such that they (i) decouple the third transmission line RF3 from ground and (ii) couple a different transmission line to ground. When a signal trace ST of a particular transmission line (among the transmission lines RF1-RF3) is coupled to ground by the metal pieces 301, 302, that transmission line will also be electrically isolated from the pair of transmission lines (among the transmission lines RF1-RF3) that are capacitively coupled to each other by the metal line ML.

Figure 4A:
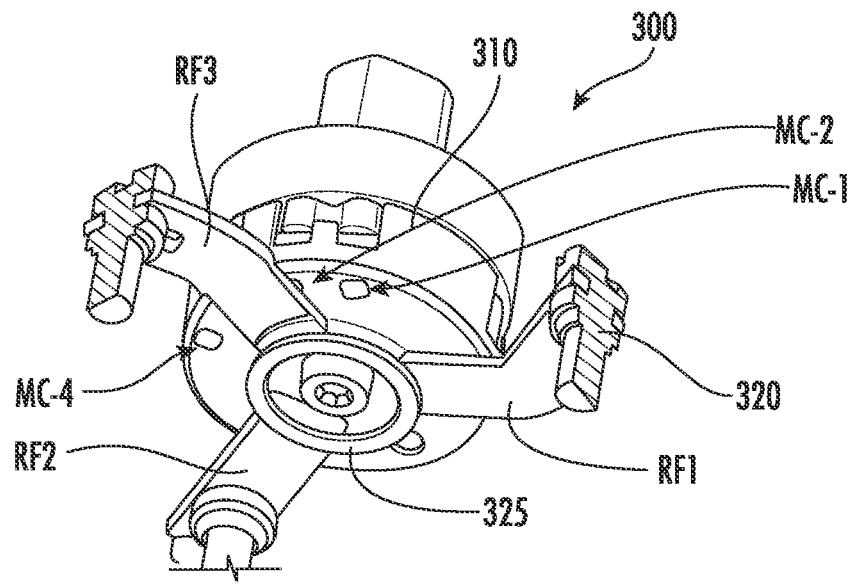
FIG. 4A is a bottom perspective view of the RF switch of FIG. 3.

FIG. 4A is a bottom perspective view of the RF switch 300. As shown in FIG. 4A, movable contacts MC may downwardly protrude through a bottom surface of a housing 310 of the switch 300. The housing 310 may be, for example, a plastic housing or another type of insulating housing. As an example, the housing 310 may be a polyether ether ketone ("PEEK") housing. When the housing 310 is rotated to the position shown in FIG. 4A, a second contact MC-2 and a third contact MC-3 (FIG. 3) may be coupled to a signal trace ST (FIG. 3) of a third RF transmission line RF3 of the switch 300, whereas first and fourth contacts MC-1, MC-4 may be horizontally spaced apart from the third transmission line RF3.

Figure 7A:
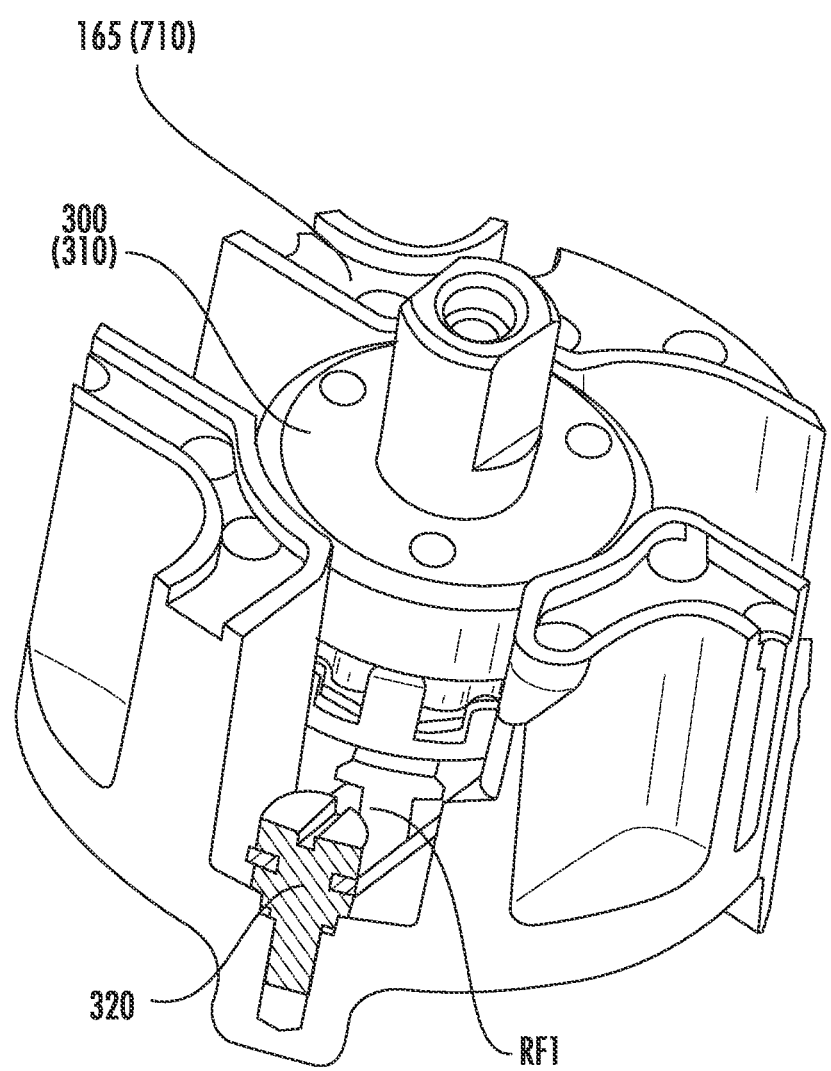
FIG. 7A is a top perspective view of a body of an RF filter device having the RF switch of FIG. 3 therein.

Each of the transmission lines RF1-RF3 may be held in place by a respective dielectric screw 320. For example, each screw 320 may be a PEEK screw that is fastened to a body 710 (FIG. 7A) of an RF filter device 165 (FIG. 7A). Accordingly, the transmission lines RF1-RF3 may remain stationary when the overlying housing 310 rotates. Moreover, a dielectric washer 325 may press the transmission lines RF1-RF3 against the bottom surface of the housing 310. The washer 325 may thus ensure that a contact MC that protrudes through the bottom surface of the housing 310 can physically contact a signal trace ST of a transmission line (among the transmission lines RF1-RF3) when the contact MC vertically overlaps the transmission line.

Figure 4B:
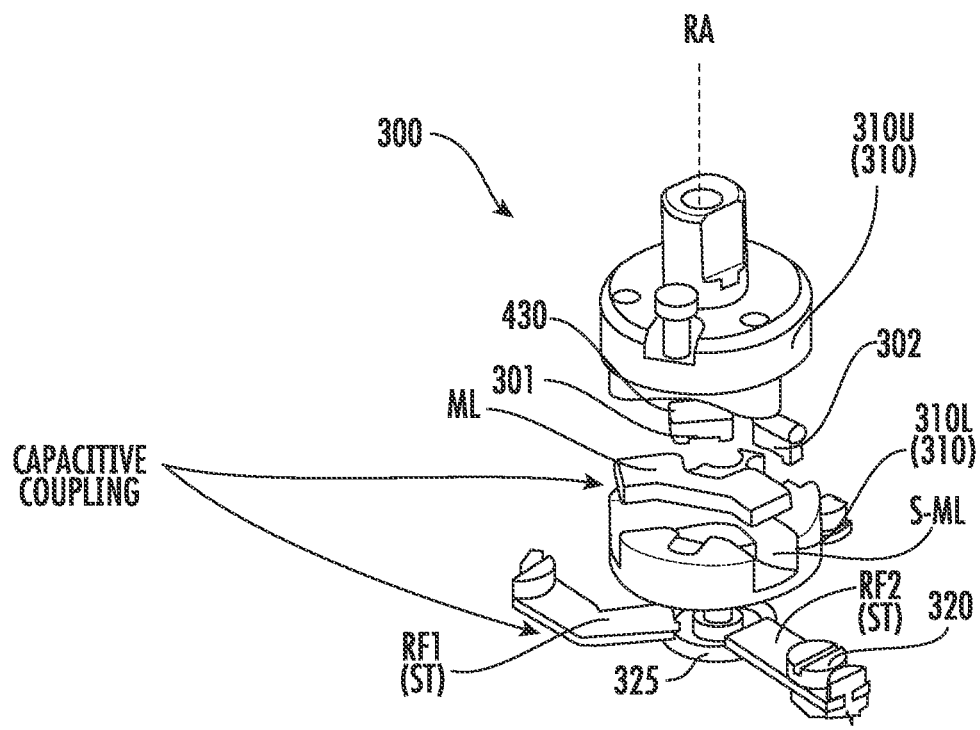
FIG. 4B is an exploded top perspective view of the RF switch of FIG. 4A.

FIG. 4B is an exploded top perspective view of the RF switch 300. As shown in FIG. 4B, a housing 310 of the switch 300 may include an upper rotary body 310U and a lower rotary body 310L. The upper rotary body 310U and the lower rotary body 310L may be attached to each other (e.g., by a dielectric screw) and may concurrently rotate about a rotational axis RA of the housing 310. Because the upper rotary body 310U and the lower rotary body 310L may rotate as a combined body, they may be collectively referred to as a "rotary body" or a "rotating portion" of the switch 300. The axis RA may pass through, for example, a center point of the upper rotary body 310U and a center point of the lower rotary body 310L. For simplicity of illustration, however, only a portion of the axis RA that extends upward from the upper rotary body 310U is shown in FIG. 4B.

The lower rotary body 310L may have a space S-ML therein that is configured to receive a movable metal line ML. The lower rotary body 310L may likewise have spaces S-MC (FIG. 6B) therein that are configured to receive respective movable metal pieces 301, 302. Each metal piece 301, 302 may have a respective elastic layer 430 thereon. The elastic layer 430 may comprise, for example, silicone rubber or another material that provides a degree of springiness. As a result, the metal pieces 301, 302 can move vertically upward and downward due to a spring effect of the layer 430. The elastic layer 430 may thus reduce friction when metal contacts MC (FIG. 4A) of the metal pieces 301, 302 transition into or out of physical contact with a signal trace ST of a transmission line, or with a ground connection of a body 710 (FIG. 7A) of an RF filter device 165 (FIG. 7A), as the lower rotary body 310L rotates about the axis RA.

The contacts MC and the metal line ML move in the horizontal plane that is shown in FIG. 3 when the lower rotary body 310L rotates about the axis RA. The term "movable," as used herein with respect to the metal pieces 301, 302 (or the contacts MC thereof) and the metal line ML, thus may refer to movement that is dependent upon rotation of the lower rotary body 310L. Such movement is relative to the transmission lines RF1-RF3 rather than relative to the lower rotary body 310L. Accordingly, with the exception of vertical movement of the metal pieces 301, 302 due to the respective elastic layers 430 thereon, the metal pieces 301, 302 (and the contacts MC thereof) and the metal line ML may be substantially stationary relative to the lower rotary body 310L. Moreover, as used herein with respect to movement of the metal pieces 301, 302, the term "vertical" refers to a direction that is substantially parallel to the axis RA.

Figure 5A:
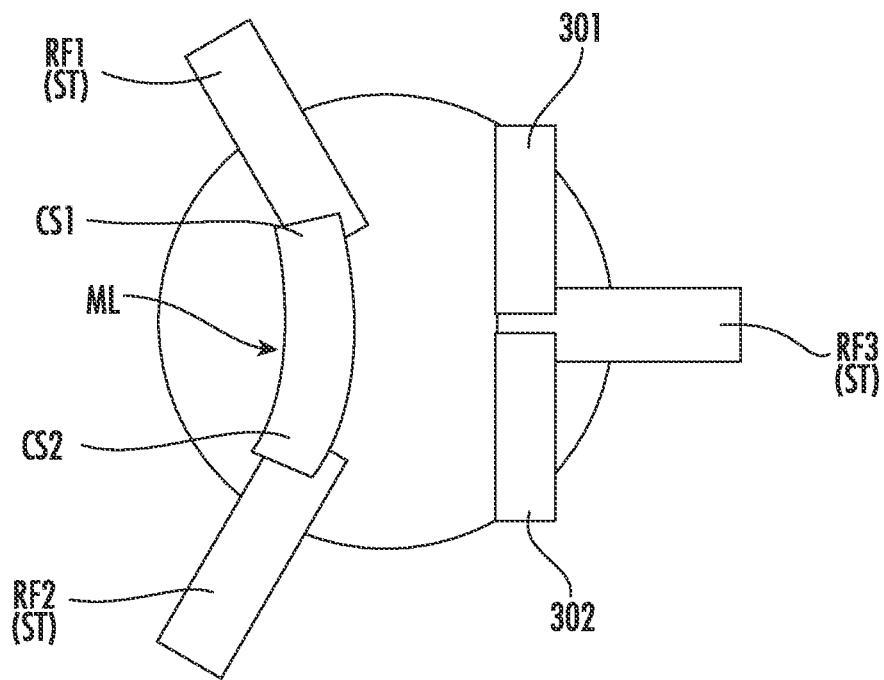
FIGS. 5A and 5B are schematic top views of the RF switch of FIG. 3 during respective filtering-response modes of an RF filter device.
Figure 5B:
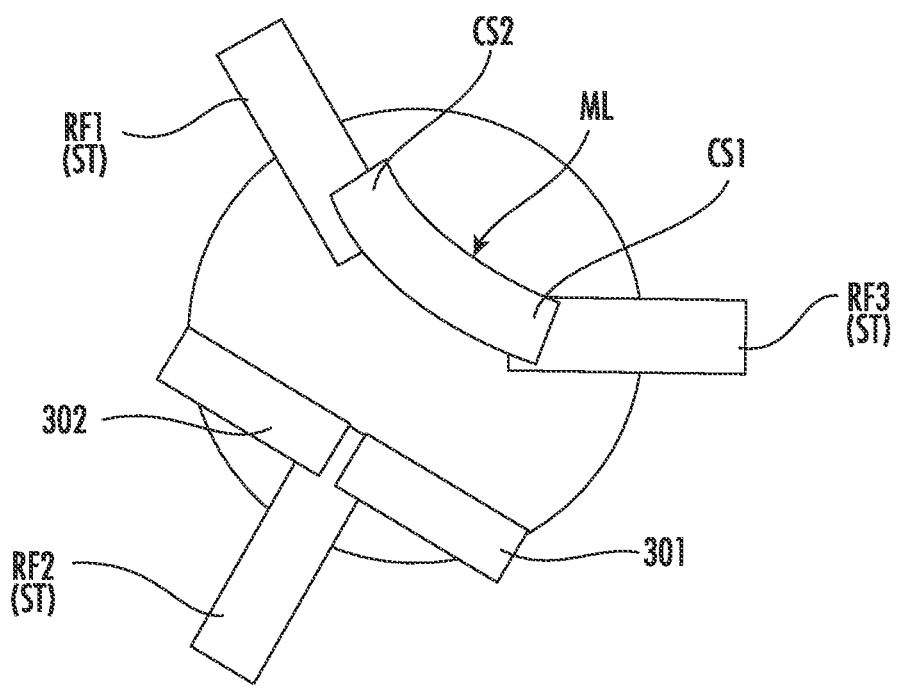

FIGS. 5A and 5B are schematic top views of the RF switch 300 (FIG. 3) during respective filtering-response modes of an RF filter device 165 (FIGS. 1C and 1D). In particular, FIG. 5A illustrates a first filtering-response mode in which a movable metal line ML has a first position at which it capacitively couples first and second RF transmission lines RF1, RF2 of the switch 300 to each other. For example, the capacitive coupling may result from vertical overlap between first and second coupling sections CS1, CS2 of the metal line ML and the first and second RF transmission lines RF1, RF2, respectively. When the metal line ML is at its first position, movable metal pieces 301, 302 of the switch 300 couple a signal trace ST of a third RF transmission line RF3 of the switch 300 to an external ground connection, such as to a ground (e.g., copper) connection that is stamped onto a body 710 (FIG. 7A) of the filter device 165. The body 710 may be a conductive (e.g., metal) body/housing of the filter device 165. In the first filtering-response mode, the filter device 165 (e.g., resonators therein) may be tuned to reject frequencies in a particular band.

FIG. 5B illustrates a second filtering-response mode in which the metal line ML has a second position at which it capacitively couples the first and third transmission lines RF1, RF3 to each other. In particular, movement of the metal line ML from the first position to the second position may (i) capacitively decouple a first coupling section CS1 of the metal line ML from the first transmission line RF1 and (ii) capacitively couple the first coupling section CS1 to the third transmission line RF3 via vertical overlap therebetween. A second coupling section CS2 of the metal line ML may likewise capacitively decouple from the second transmission line RF2 and instead capacitively couple to the first transmission line RF1 via vertical overlap therebetween.

When the metal line ML is at its second position, the movable metal pieces 301, 302 couple a signal trace ST of the second RF transmission line RF2 to ground. The metal pieces 301, 302 may move simultaneously with the metal line ML. Specifically, the first and second coupling sections CS1, CS2 of the metal line ML are configured to move simultaneously with (i) each other and (ii) the metal pieces 301, 302. As shown in the sequence of FIGS. 5A and 5B, the simultaneous movement may be clockwise in a horizontal plane. Alternatively, the simultaneous movement may be counterclockwise.

In some embodiments, the simultaneous movement may comprise revolving the first and second coupling sections CS1, CS2 and the metal pieces 301, 302 around a rotational axis RA (FIG. 4B) of the switch 300. The transmission lines RF1-RF3, by contrast, are each stationary and thus do not revolve around the axis RA. Rather, referring again to FIGS. 3 and 4B, the first and second coupling sections CS1, CS2 and the metal pieces 301, 302 may move relative to the transmission lines RF1-RF3 when a rotary body 310U/310L (that houses the first and second coupling sections CS1, CS2 and the metal pieces 301, 302) rotates about the axis RA, above the stationary transmission lines RF1-RF3.

In the second filtering-response mode (when the metal line ML is at its second position), the filter device 165 (e.g., resonators therein) may pass frequencies that are rejected in the first filtering-response mode. The second filtering-response mode may thus have a wider passband than the first filtering-response mode. For example, a passband of 3.7-3.8 gigahertz ("GHz") may be widened to 3.7-3.98 GHz. As a result, a wider frequency band can be used by an array 170 (FIG. 1E) of radiating elements 271 (FIG. 2) and a radio 142 (FIG. 1E) that are coupled to the filter device 165. In some embodiments, the filter device 165 may have two RF filters (e.g., only two filters) therein, and the switch 300 may switch between the two filters. Accordingly, using the first and second filtering-response modes may comprise using respective ones of the two filters.

The filter device 165 may, in some embodiments, be integrated into a base station antenna 100 (FIG. 1A), such as in a feed network 150 (FIG. 1E) thereof. In other embodiments, the filter device 165 may be external to the antenna 100. For example, the filter device 165 may be mounted on a base station antenna tower. As an example, a standalone unit that is coupled between a radio 142 (FIG. 1B) and the antenna 100 may comprise the filter device 165.

In some embodiments, the filter device 165 may provide a notch filter for rejection of particular frequencies. The first filtering-response mode (FIG. 5A) and the second filtering-response mode (FIG. 5B) of the filter device 165 may thus provide different amounts of rejection, respectively. For example, in one of the two modes, the filter device 165 may be configured to provide at least 30 dB of rejection, such as to block frequencies between 3.82 GHz and 3.86 GHz. The filter device 165 may be further configured to provide at least 40 dB of rejection in that mode, such as to block frequencies between 3.86 GHz and 3.87 GHz. Moreover, the filter device 165 may be configured to provide at least 50 dB of rejection in that mode, such as to block frequencies between 3.87 GHz and 3.98 GHz. Conversely, in the other of the two modes, the filter device 165 may provide no more than 0.3 dB of insertion loss for frequencies between 3.82 GHz and 3.98 GHz or a portion thereof.

By providing both of the two modes, out-of-band spurious emissions (e.g., as generated by a 5G cellular radio, such as the radio 142) may be reduced during a certain period of time. In some embodiments, a default mode of the filter device 165 may be a particular one of the two modes when the filter device 165 is installed. The mode can subsequently be changed to the other (e.g., bypass) mode in response to receiving an Antenna Interface Standards Group ("AISG") command (or a custom command) via a port 162 (FIG. 1C) of the filter device 165.

FIG. 6A is a top perspective view of the RF switch 300. As shown in FIG. 6A, a housing 310 of the switch 300 may include a plurality of downwardly-protruding portions 310P, each of which is configured to hold a movable contact MC (FIG. 4A) of a movable metal piece 301 or 302 (FIG. 6B) of the switch 300 against an underlying RF transmission line of the switch 300 (or against an underlying body 710 (FIG. 7A) of an RF filter device 165 (FIG. 7A)). In some embodiments, the protruding portions 310P may comprise the same material as the housing 310.

FIG. 6B is an exploded top perspective view of the switch 300. As shown in FIG. 6B, the protruding portions 310P of the switch 300 may be in an upper rotary body 310U of the housing 310. A lower rotary body 310L of the housing 300 may include spaces S-MC that are configured to receive the protruding portions 310P, elastic layers 430, and metal pieces 301, 302. In a first (e.g., relaxed) state of the elastic layers 430, each movable contact MC (FIG. 4A) of the metal pieces 301, 302 may protrude downward beyond a bottom surface of the lower rotary body 310L to physically contact a signal trace ST (FIG. 3) of an RF transmission line of the switch 300 (or to physically contact a ground connection of the body 710 of the filter device 165). Moreover, in a second (e.g., compressed) state of the elastic layers 430, the contacts MC can move upward to at least partially retract into the bottom surface of the lower rotary body 310L. In some embodiments, the protruding portions 310P may physically contact the elastic layers 430 in each of the first and second states.

The top perspective views shown in FIGS. 6A and 6B illustrate that the housing 310 of the switch 300 has been rotated relative to the top perspective view shown in FIG. 4B. Accordingly, FIGS. 6A and 6B provide different views of the same switch 300 that is shown in FIG. 4B.

FIG. 6C is an exploded side perspective view of the switch 300. As shown in FIG. 6C, the protruding portions 310P of the housing 310 may vertically overlap the elastic layers 430 and the movable metal pieces 301, 302. Moreover, the metal pieces 301, 302 may be separate from each other and separate from the metal line ML. The metal pieces 301, 302 and the metal line ML may each be configured to revolve around a rotational axis RA of the switch 300 as the housing 310 rotates about the axis RA.

For simplicity of illustration, only a portion of the axis RA that extends vertically downward from the bottom of the switch 300 is shown in FIG. 6C. It will be understood, however, that the axis RA also extends vertically upward beyond the top of the switch 300, as shown in FIG. 4B, as well as between the bottom and the top of the housing 310. Specifically, the axis RA extends vertically between the transmission lines RF1-RF3, as well as between the metal line ML and each of the metal pieces 301, 302.

FIG. 7A is a top perspective view of a body 710 of an RF filter device 165 having the RF switch 300 therein. For simplicity of illustration, only a portion of the body 710 that is adjacent the switch 300 is shown in FIG. 7A. The bottom of the switch 300 may be on a floor of the body 710. A first RF transmission line RF1 of the switch 300 may be fastened to the floor of the body 710 by a dielectric screw 320. Second and third RF transmission lines RF2, RF3 (FIG. 7B) may similarly be fastened to the floor of the body 710 by respective dielectric screws 320. Each of the transmission lines RF1-RF3 may be coupled to a respective component (e.g., an RF connector/port or an RF transmission line) of the filter device 165 such that the switch 300 can switch between first and second filtering-response modes of the filter device 165. Moreover, a circular side surface of a housing 310 of the switch 300 may be between a plurality of walls of the body 710.

Figure 7B:
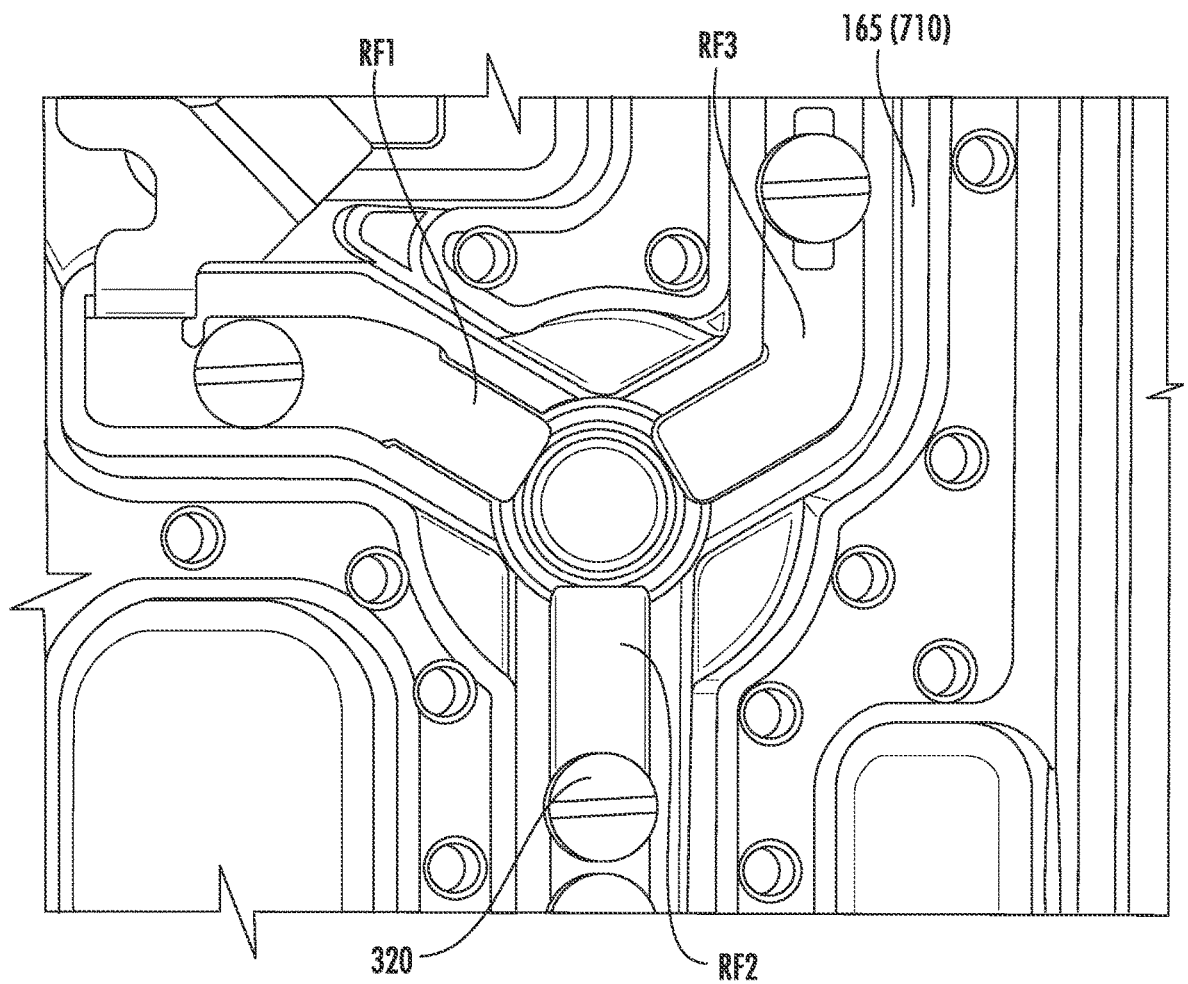
FIGS. 7B and 7C are top views of the body of the filter device of FIG. 7A.
Figure 7C:
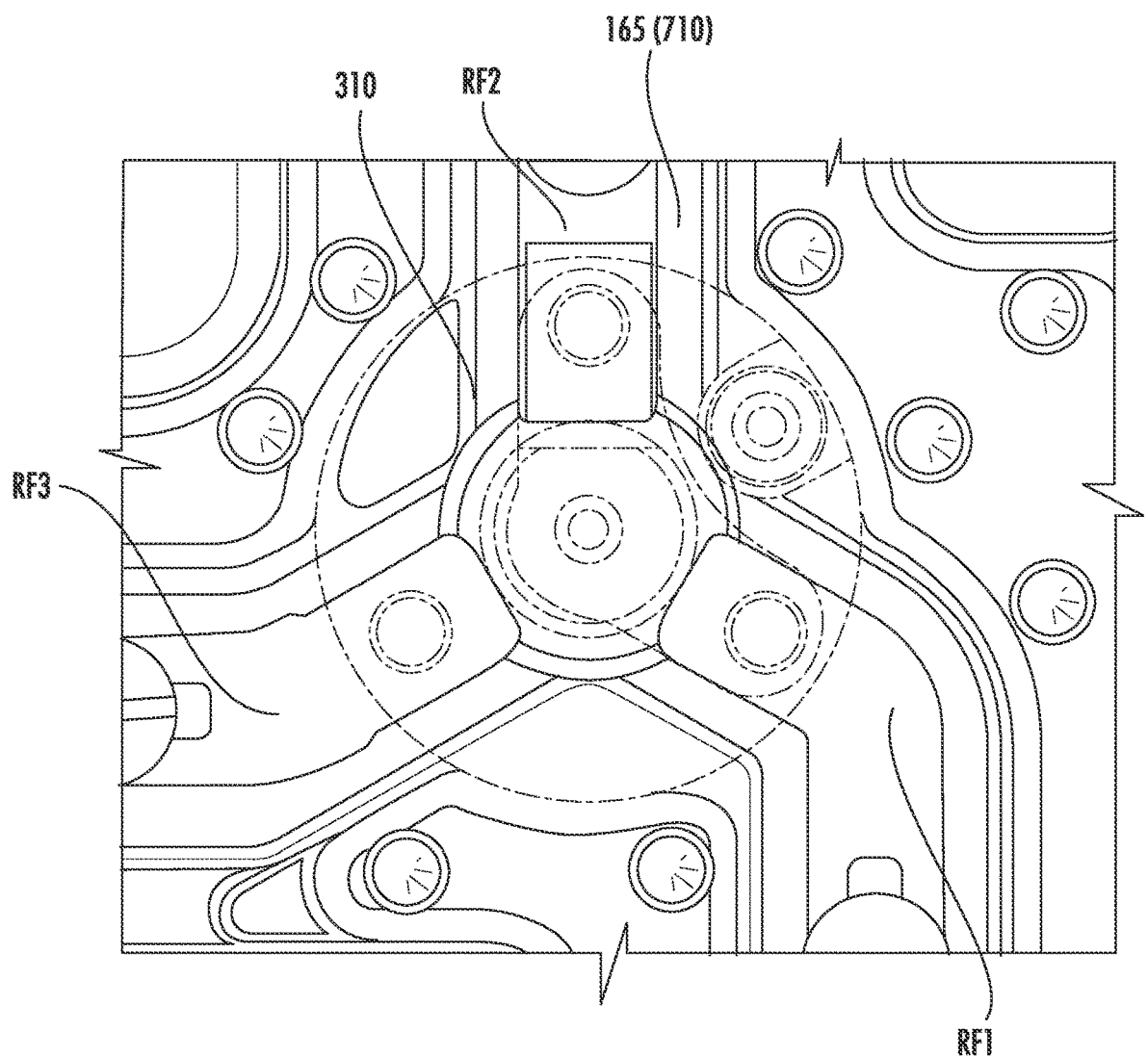

FIGS. 7B and 7C are top views of the body 710 of the filter device 165. For simplicity of illustration, the housing 310 (and the components therein) of the switch 300 are omitted from view in FIG. 7B. Accordingly, FIG. 7B shows an unobstructed view of the transmission lines RF1-RF3 that are fastened to the body 710 by respective dielectric screws 320. Moreover, FIG. 7C depicts the housing 310 as being translucent over the transmission lines RF1-RF3 and the body 710, for simplicity of illustration. It will be understood, however, that the housing 310, which is configured to rotate over the transmission lines RF1-RF3 and the body 710, may be opaque.

Figure 8:
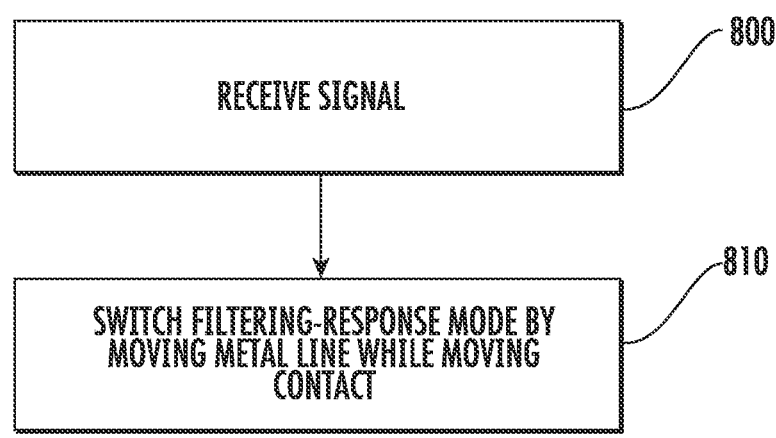
FIG. 8 is a flowchart illustrating operations of switching a filtering-response mode of an RF filter device, according to embodiments of the present invention.

FIG. 8 is a flowchart illustrating operations of switching a filtering-response mode of an RF filter device 165 (FIG. 7A), according to embodiments of the present invention. The operations may include switching (Block 810) between first and second filtering-response modes of the filter device 165 by moving a metal line ML (FIG. 3) of an RF switch 300 (FIG. 3) between different first and second positions, respectively, while also moving at least one contact MC (FIG. 3) of the switch 300. For example, the metal line ML and the contact(s) MC may be entirely displaced by rotating a housing 310 (FIG. 4A) of the switch 300 over RF transmission lines RF1-RF3 (FIG. 3) of the switch 300. FIGS. 5A and 5B show an example of such switching between first and second filtering-response modes by moving the metal line ML and the contact(s) MC relative to the RF transmission lines RF1-RF3.

In some embodiments, the switching (Block 810) may be performed in response to receiving (Block 800) a signal that is used to remotely control the filter device 165. For example, the filter device 165, which may be internal or external to a base station antenna 100 (FIG. 1A), may filter uplink and/or downlink RF signals for the antenna 100 and may change its filtering response (e.g., to use a wider passband) based on the received signal. As an example, the received signal may comprise an AISG command that is transmitted to a port 162 (FIG. 1C) of the filter device 165 (e.g., via the antenna 100) from an original location/transmitter that is outside of the antenna 100.

Rotary RF switches 300 (FIG. 3) according to embodiments of the present invention may provide a number of advantages. These advantages include achieving good isolation by using movable (e.g., horizontally-sliding) contacts MC (FIG. 3) that ground a signal trace ST (FIG. 3) of an RF transmission line of the switch 300 that is electrically isolated from other RF transmission lines of the switch 300. The advantages also include reduced insertion losses relative to conventional RF electromechanical relays/switches. Further advantages relative to conventional RF electromechanical relays/switches include avoiding the use of a separate DC block (because the metal line ML already provides capacitive coupling), lower cost, lower PIM distortion, and the absence of an additional PCB for switch assembly and connection to an RF filter device 165 (FIGS. 1C, 1D, and 7A).

Though the switch 300 is described herein as being usable with RF filters (e.g., the filter device 165), it is not limited thereto. Rather, switches 300 according to embodiments of the present invention may be usable with systems/devices other than RF filters.

Figure 9A:
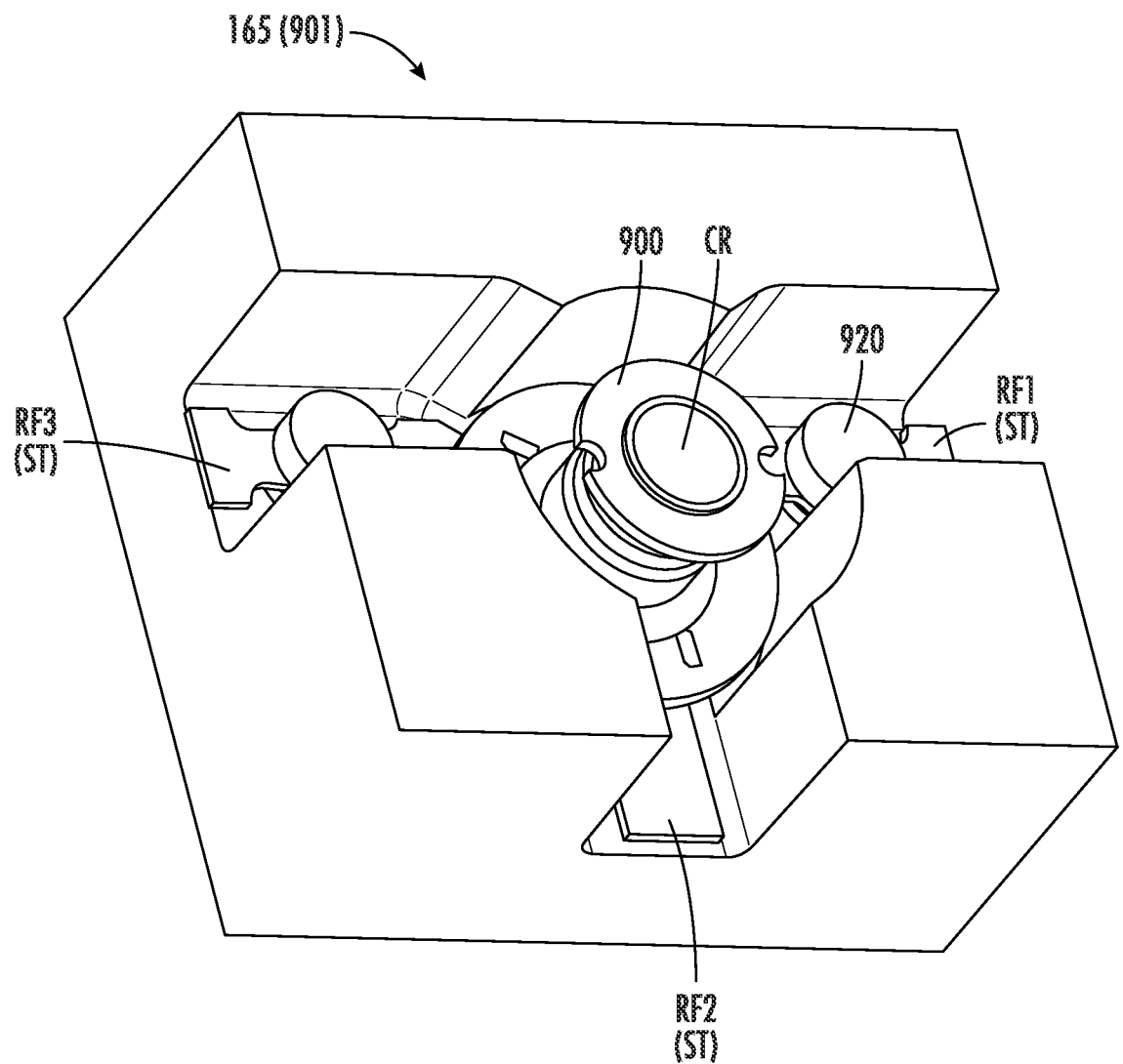
FIG. 9A is a top perspective view of a body of an RF filter device having an RF switch therein, according to other embodiments of the present invention.

FIG. 9A is a top perspective view of a body 901 of an RF filter device 165 having an RF switch 900 therein, according to other embodiments of the present invention. The body 901 may be a conductive (e.g., metal) body/housing of the filter device 165. A conductive rod CR may protrude upward from a floor 901F (FIG. 9C) of the body 901 and may be coupled to a ground connection of (e.g., copper that is stamped on) the body 901. The conductive rod CR can thus serve as a grounded isolation wall. The RF switch 900 may be configured to rotate around the conductive rod CR and over transmission lines RF1-RF3. The conductive rod CR, on the other hand, is stationary and may be formed as part of the body 901 or as a separate piece that is attached to the body 901.

Each of the transmission lines RF1-RF3 may be held in place by a respective dielectric screw 920. For example, each screw 920 may be a PEEK screw that is fastened to the body 901. Accordingly, the transmission lines RF1-RF3 may remain stationary when the overlying RF switch 900 rotates.

Figure 9B:
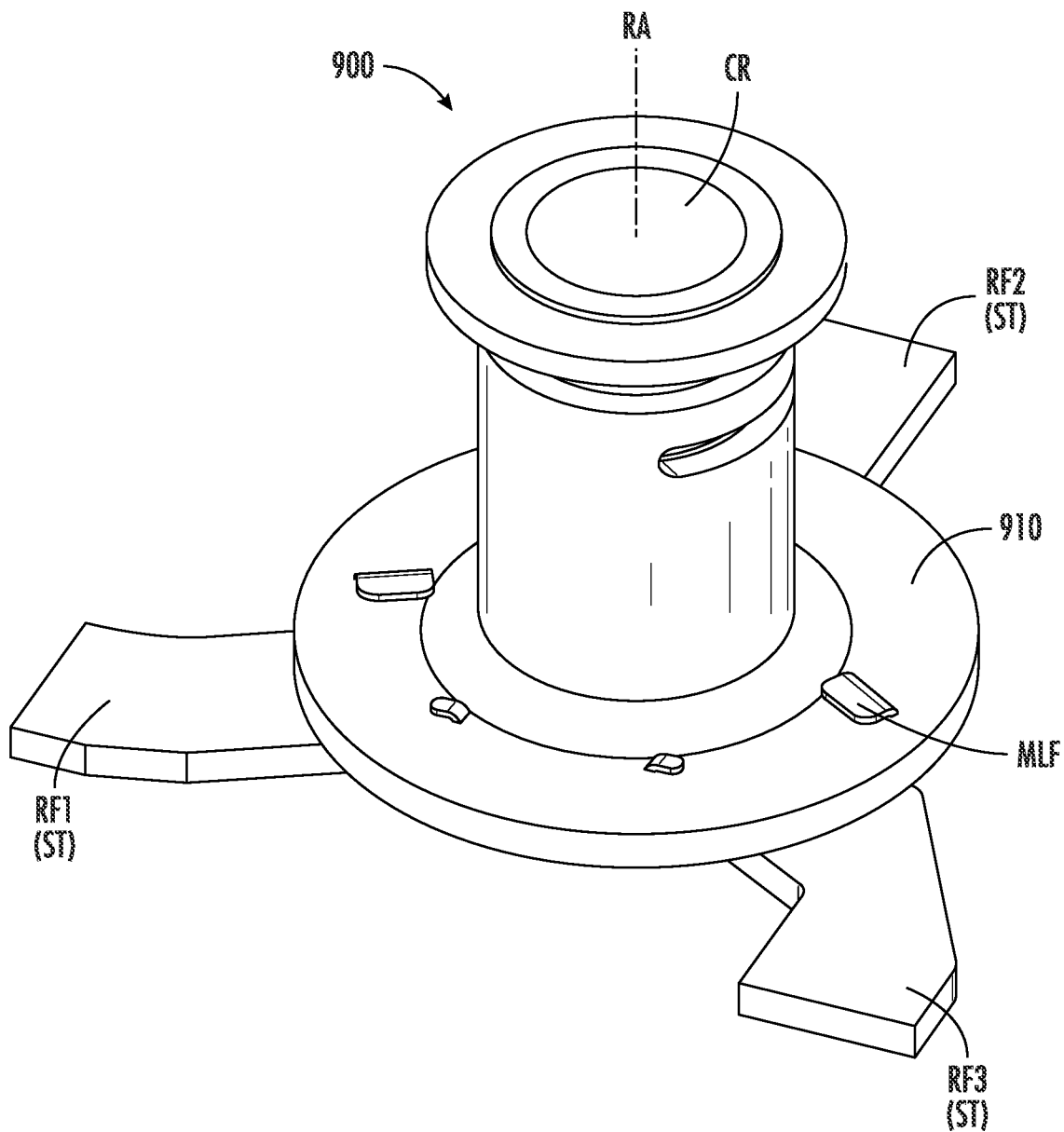
FIG. 9B is a top perspective view of the RF switch of FIG. 9A.

FIG. 9B is a top perspective view of the RF switch 900 of FIG. 9A. As shown in FIG. 9B, a rotational axis RA of the switch 900 may pass through the conductive rod CR, such as a center point thereof. The rotational axis RA may thus be referred to herein as being "defined by" the conductive rod CR. The RF switch 900 includes a rotary body 910 that is configured to revolve around the rotational axis RA. Moreover, a movable metal line MLF is attached to the rotary body 910, and the movable metal line MLF revolves around the rotational axis RA when the rotary body 910 rotates. In some embodiments, the rotary body 910 may be a plastic (e.g., PEEK) body.

Figure 9C:
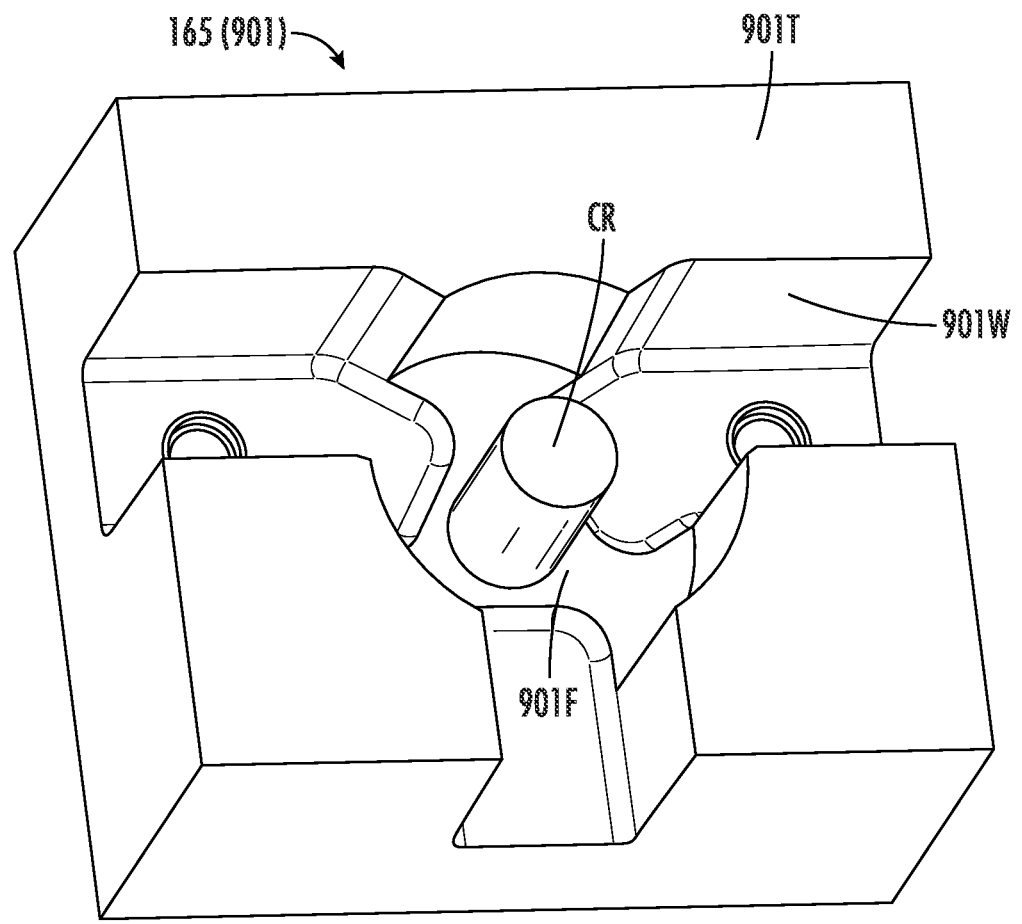
FIGS. 9C and 9D are top perspective views of the body of the filter device of FIG. 9A with the RF switch removed.
Figure 9D:
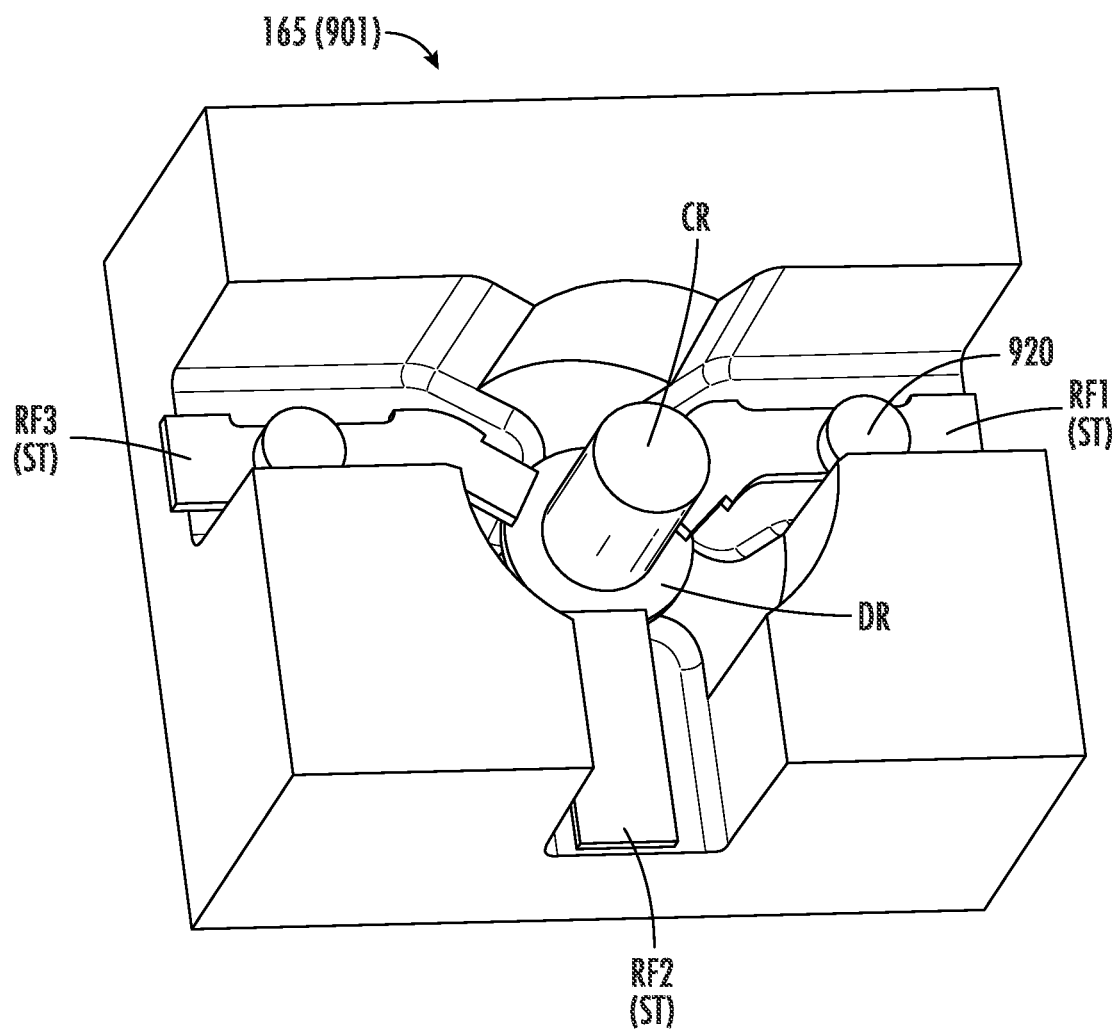

FIGS. 9C and 9D are top perspective views of the body 901 of the filter device 165 of FIG. 9A with the RF switch 900 removed from view for simplicity of illustration. As shown in FIG. 9C, the conductive rod CR protrudes upward from the floor 901F (e.g., a lower interior surface) of the body 901. In some embodiments, the body 901 may be a single metal piece that includes the conductive rod CR. Accordingly, the conductive rod CR may be a metal stalk that comprises the same metal (e.g., aluminum) as the body 901.

A top surface of the conductive rod CR may, in some embodiments, be coplanar with a top surface 901T of the body 901. In other embodiments, the top surface of the conductive rod CR may be at a slightly higher or lower level than the top surface 901T of the body 901.

The body 901 also includes a plurality of vertical walls 901W that define a cavity around the conductive rod CR. The rotary body 910 (FIG. 9B) of the RF switch 900 can be installed for rotation within the cavity of the body 901 by mounting the rotary body 910 on the conductive rod CR.

Referring to FIG. 9D, dielectric screws 920 may fasten the transmission lines RF1-RF3 to the floor 901F (FIG. 9C) while keeping the transmission lines RF1-RF3 spaced apart from the floor 901F. Moreover, a dielectric ring DR may be installed on the conductive rod CR. The dielectric ring DR may be a plastic washer that fits around a lower circumference of the conductive rod CR that is adjacent the floor 901F. Accordingly, installation of the dielectric ring DR may include sliding/pushing the dielectric ring DR down from an upper circumference of the conductor rod CR to the lower circumference.

The transmission lines RF1-RF3 may extend from an outer circumference of the dielectric ring DR. An inner portion of the dielectric ring DR is between the transmission lines RF1-RF3 and the conductive rod CR. The transmission lines RF1-RF3 thus do not physically contact the conductive rod CR. Rather, respective signal traces ST of the transmission lines RF1-RF3 are spaced apart from the conductive rod CR. Nor do the transmission lines RF1-RF3 physically contact any metal of the RF switch 900. Instead, the RF switch 900 is a contactless switch that couples respective signal traces ST (e.g., copper traces) of two of the transmission lines RF1-RF3 to each other by capacitively coupling the two signal traces ST to a movable metal line MLF (FIG. 9E), while the conductive rod CR provides a grounded isolation wall that electrically isolates a signal trace ST of the remaining (i.e., non-coupled) one of the transmission lines RF1-RF3 from the two of the transmission lines RF1-RF3 that are coupled to each other. The conductive rod CR, which is located between the non-coupled signal trace ST and the signal traces ST of the two of the transmission lines RF1-RF3 that are coupled to each other, can thus improve RF isolation of the non-coupled signal trace ST by providing a ground reference inside the RF switch 900. As used herein, the term "contactless" refers to a rotary switch that does not include any metal that physically contacts any of the signal traces ST of the transmission lines RF1-RF3.

Figure 9E:
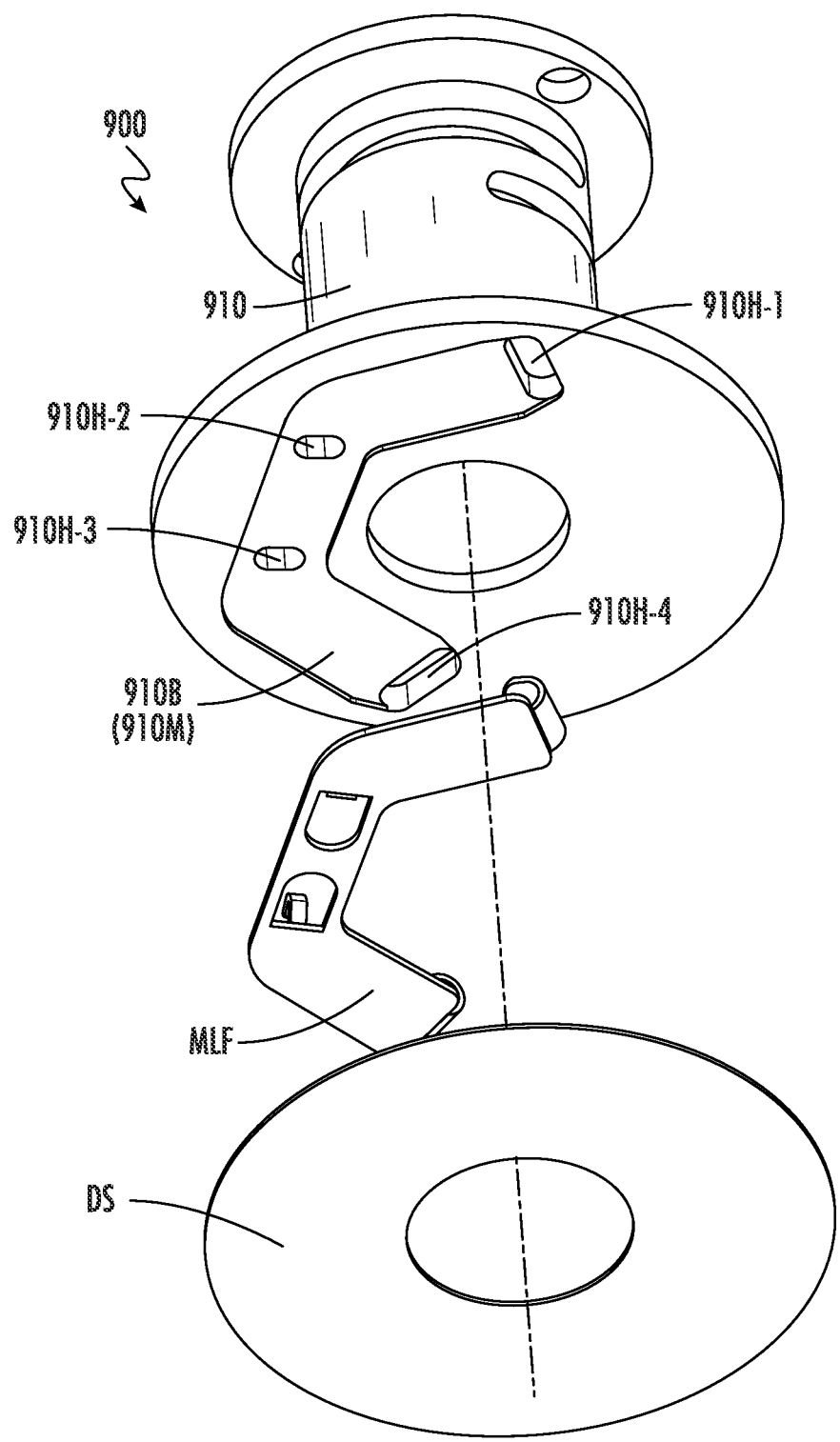
FIG. 9E is an exploded bottom perspective view of the RF switch of FIG. 9A.

FIG. 9E is an exploded bottom perspective view of the RF switch 900 of FIG. 9A. As shown in FIG. 9E, the RF switch 900 includes a rotary body 910 that is configured to rotate around a conductive rod CR (FIG. 9A). For example, the conductive rod CR may extend into the center of the rotary body 910. The RF switch 900 also includes a movable metal line MLF that is on a lower surface 910B of the rotary body 910. Moreover, the RF switch 900 includes a dielectric separator DS that is between the movable metal line MLF and the transmission lines RF1-RF3 that the movable metal line MLF rotates over when the rotary body 910 rotates. For example, the dielectric separator DS may be a thin plastic foil that separates the movable metal line MLF from the signal traces ST of the transmission lines RF1-RF3. In some embodiments, the dielectric separator DS may be an adhesive polyimide film/sheet, such as adhesive KAPTON® tape.

The lower surface 910B of the rotary body 910 may, in some embodiments, be a bottom surface of a recessed (e.g., cavity/slot) portion 910M of the rotary body 910 that is shaped/molded to receive the movable metal line MLF. The recessed portion 910M may also include a plurality of holes 910H through which portions of the movable metal line MLF can extend to hold the movable metal line MLF in place on the rotary body 910. For example, the recessed portion 910M may include four holes 910H-1 through 910H-4.

Figure 9F:
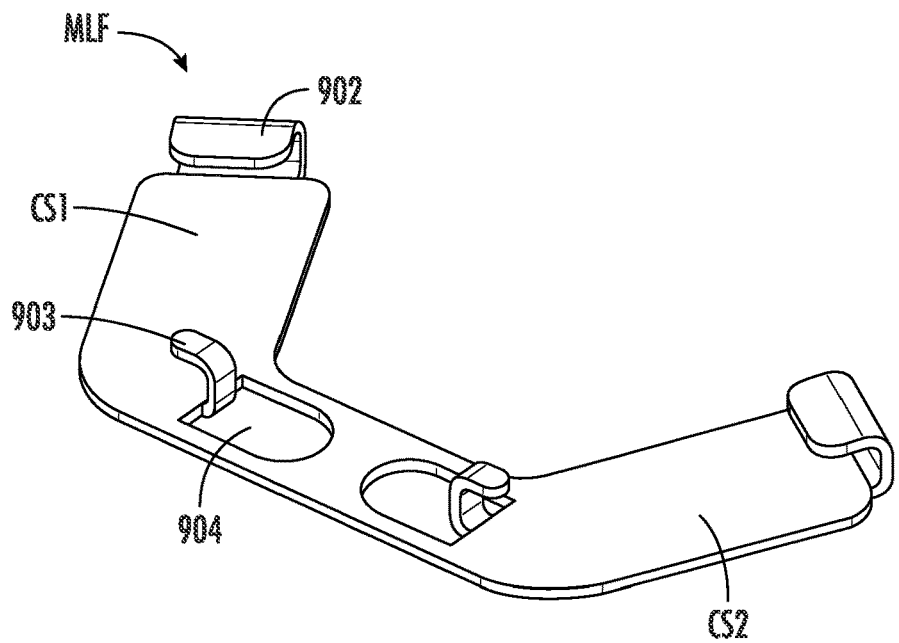
FIG. 9F is a top perspective view of the movable metal line of FIG. 9E.

FIG. 9F is a top perspective view of the movable metal line MLF of FIG. 9E. As shown in FIG. 9F, the movable metal line MLF has first and second coupling sections CS1, CS2 at opposite ends thereof. Each of the coupling sections CS1, CS2 can be attached to the rotary body 910 (FIG. 9E) by a wide finger portion 902 and/or a narrow finger portion 903. Moreover, each narrow finger portion 903 may be adjacent a respective opening 904 that is in a central region of the movable metal line MLF. In some embodiments, a pair of wide finger portions 902 can extend through holes 910H-1, 910H-4 (FIG. 9E) of the rotary body 910 and a pair of narrow finger portions 903 can extend through holes 910H-2, 910H-3 (FIG. 9E) of the rotary body 910. For example, the wide finger portions 902 may curve inward toward the central region of the movable metal line MLF and the narrow finger portions 903 may curve outward away from the central region.

Figure 9G:
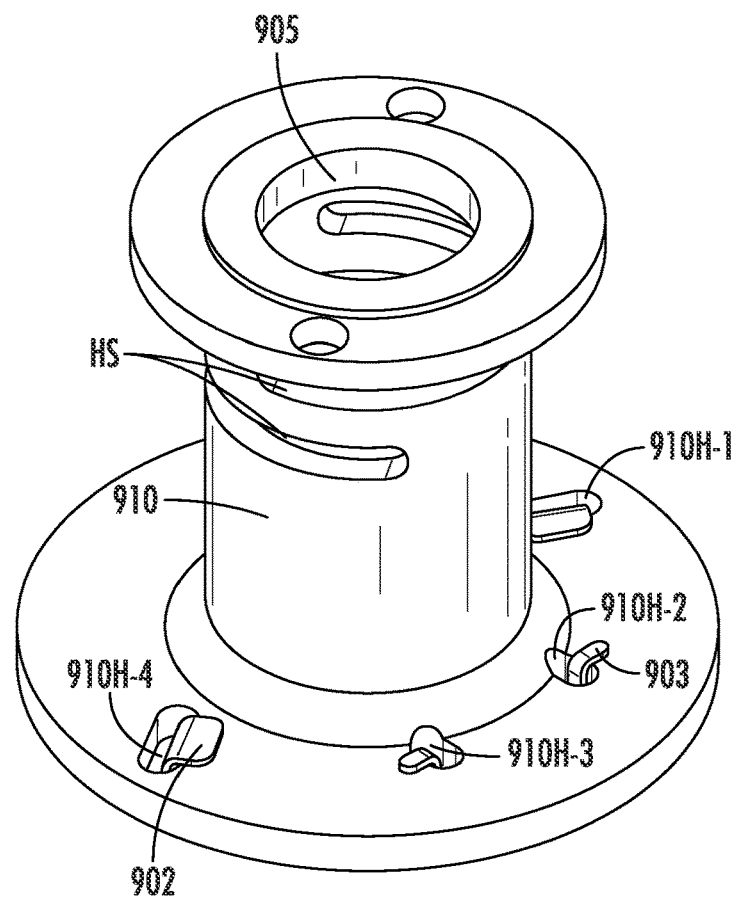
FIG. 9G is a top perspective view of the rotary body of FIG. 9E.

FIG. 9G is a top perspective view of the rotary body 910 of FIG. 9E. As shown in FIG. 9G, finger portions 902, 903 of the movable metal line MLF (FIG. 9F) extend upward through holes 910H of the rotary body 910 and then curve to extend horizontally to attach the movable metal line MLF to the rotary body 910. In some embodiments, the rotary body 910 is configured to act as a spring and to thereby keep the movable metal line MLF pressed toward signal traces ST (FIG. 9A). For example, a curved side surface of the rotary body 910 may include a plurality of horizontal slots/openings HS that facilitate springlike compression of the rotary body 910 when the rotary body 910 is pressed downward, such as when a cover of the body 901 of the filter device 165 (FIG. 9A) is placed on top of the rotary body 910, which may be a plastic or other dielectric rotary body.

A central region of the rotary body 910 includes an opening 905 that can extend continuously from the bottom of the rotary body 910 to the top of the rotary body 910. The conductive rod CR of the body 901 of the filter device 165 (FIG. 9A) can extend into the bottom end of the opening 905. Moreover, a cover may be mounted on the body 901 and may include a mechanism for rotating the rotary body 910 around the conductive rod CR. For example, the cover may include a cog wheel that overlaps, and is configured to rotate, the rotary body 910. As an example, rotation of the cog wheel may be remotely controlled in response to the signal that is discussed with respect to the flowchart of FIG. 8. In some embodiments, the cover may be a metal cover that is galvanically connected to the top surface of the conductive rod CR.

Figure 9H:
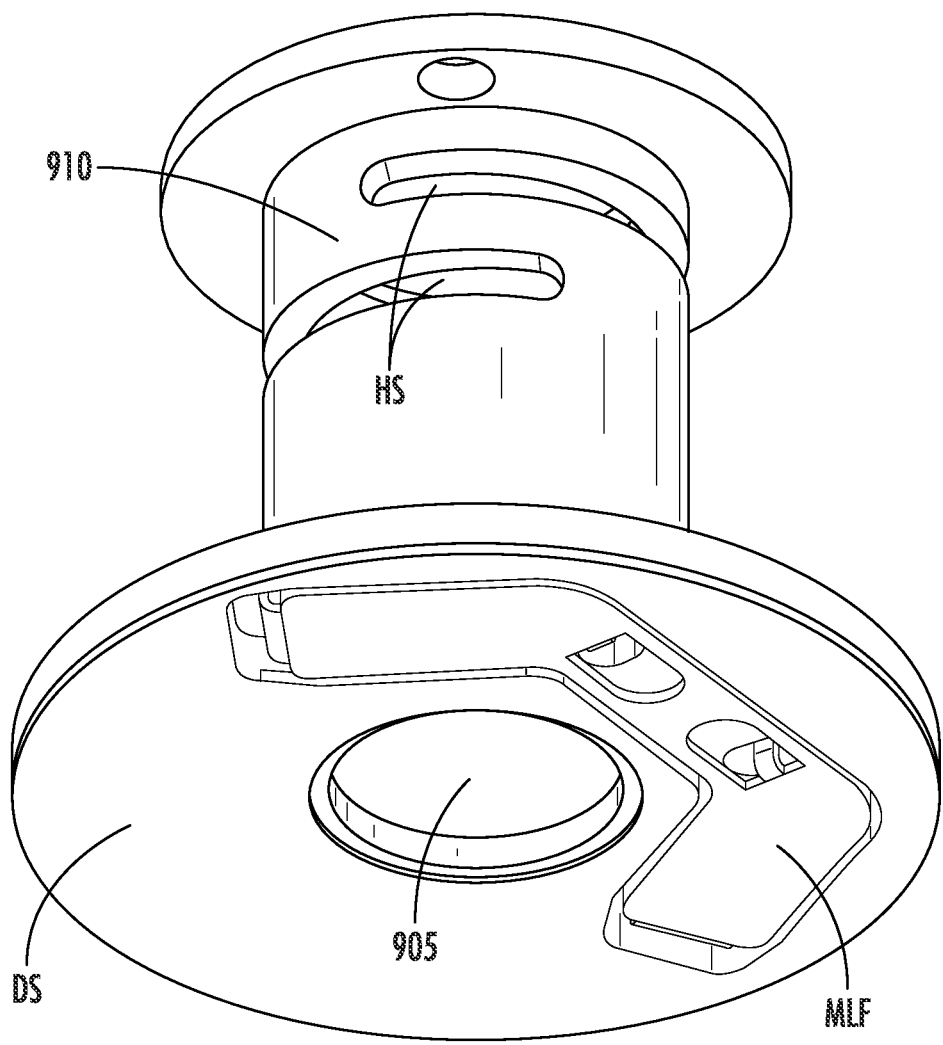
FIG. 9H is a bottom perspective view of the rotary body of FIG. 9E.

FIG. 9H is a bottom perspective view of the rotary body 910 of FIG. 9E. As shown in FIG. 9H, the dielectric separator DS may be a semi-transparent adhesive layer that covers a bottom surface of the movable metal line MLF. In some embodiments, the dielectric separator DS may have an annular shape whose opening corresponds to the opening 905 of the rotary body 910. Moreover, the movable metal line MLF may comprise, for example, copper.

Figure 10A:
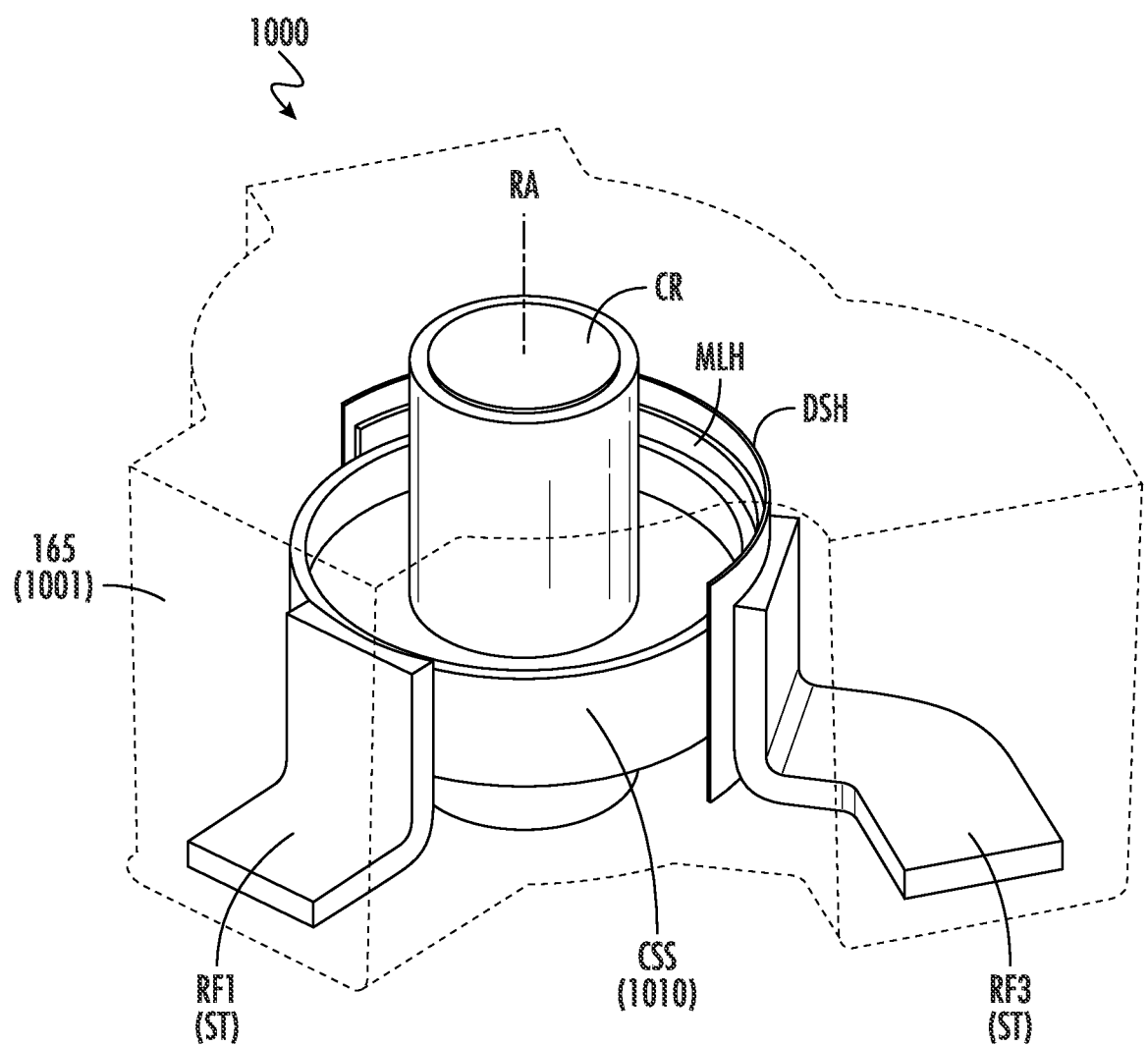
FIG. 10A is a top perspective view of a body of an RF switch, according to further embodiments of the present invention.

FIG. 10A is a top perspective view of a body of an RF switch 1000, according to further embodiments of the present invention. As with the RF switch 900 (FIG. 9B), the RF switch 1000 may be a contactless switch that revolves around a rotational axis RA that is defined by a conductive rod CR that serves as a grounded isolation wall for the transmission lines RF1-RF3. The conductive rod CR is also coupled to (and possibly integral with) a body 1001 (e.g., a ground connection thereof) of a filter device 165. The conductive rod CR can thereby improve electrical isolation for a signal trace ST of one of the transmission lines RF1-RF3 without physically contacting the signal trace ST.

The body 1001 is shown transparently in FIG. 10A for simplicity of illustrating the RF switch 1000 therein. As shown in FIG. 10A, the RF switch 1000 includes a rotary body 1010 that has a curved side surface CSS. In some embodiments, signal traces ST of the transmission lines RF1-RF3 may include respective vertically-protruding portions that face the curved side surface CSS. Moreover, the RF switch 1000 may include a movable metal line MLH that is on the curved side surface CSS. Accordingly, coupling sections CS1, CS2 (FIG. 10C) of the movable metal line MLH may be capacitively coupled to respective signal traces ST of two of the transmission lines RF1-RF3, while a signal trace ST of the remaining one of the transmission lines RF1-RF3 may be electrically isolated from the two coupled signal traces ST by a grounded isolation wall that the conductive rod CR provides. A main exterior surface of the movable metal line MLH may thus be a horizontally-facing surface. According to some embodiments, a dielectric separator DSH, which may also have a horizontally-facing main surface, may cover the main exterior surface of the movable metal line MLH.

Figure 10B:
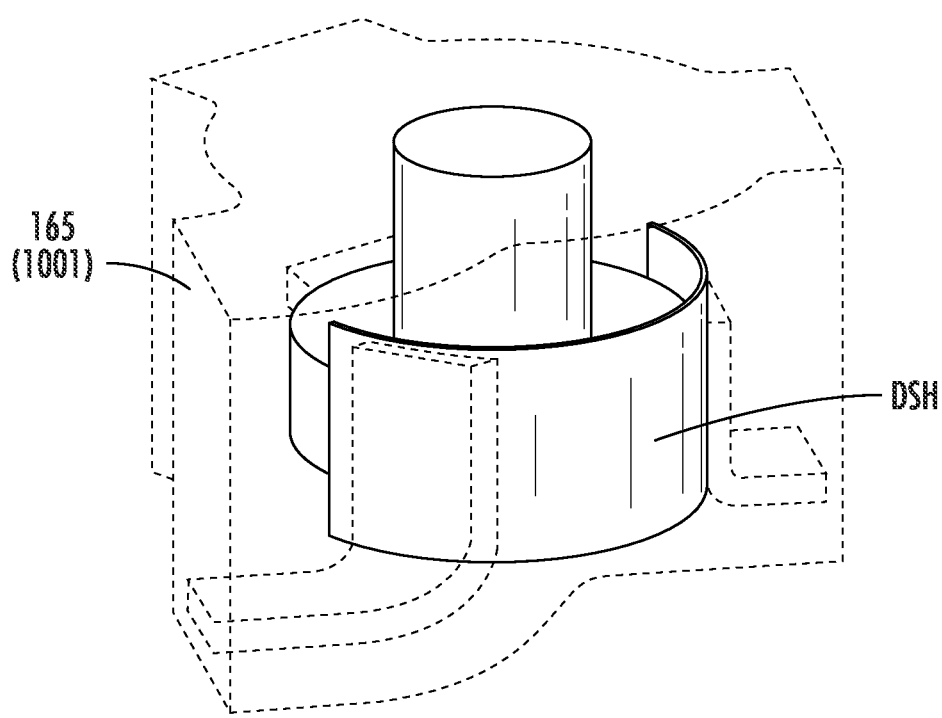
FIG. 10B is a top perspective view of the dielectric separator of FIG. 10A.

FIG. 10B is a top perspective view of the dielectric separator DSH of FIG. 10A. The dielectric separator DSH may be, for example, a thin adhesive dielectric sheet that prevents/inhibits the movable metal line MLH (FIG. 10A) from physically contacting any signal traces ST of the transmission lines RF1-RF3 (FIG. 10A). To ensure that the dielectric separator DSH covers the main exterior surface of the movable metal line MLH, the dielectric separator DSH may be both wider and taller than the movable metal line MLH in some embodiments.

Figure 10C:
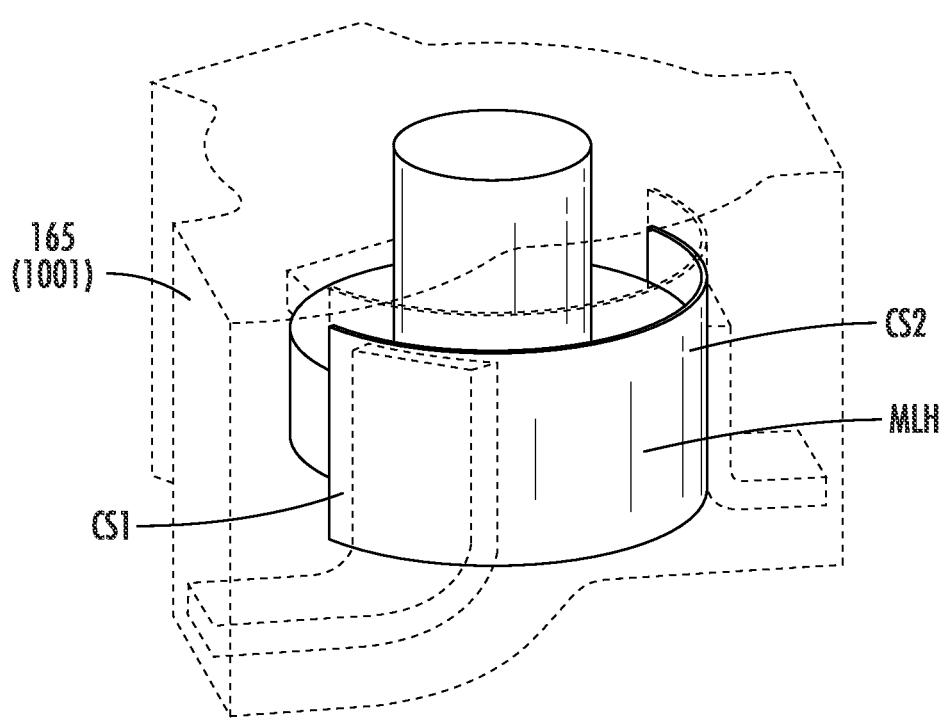
FIG. 10C is a top perspective view of the movable metal line of FIG. 10A.

FIG. 10C is a top perspective view of the movable metal line MLH of FIG. 10A. For simplicity of illustration, the dielectric separator DSH (FIG. 10A) on the movable metal line MLH is omitted from view in FIG. 10C. As shown in FIG. 10C, opposite end portions of the movable metal line MLH include respective coupling sections CS1, CS2 to which a pair of signal traces ST of the transmission lines RF1-RF3 (FIG. 10A) can be capacitively coupled. The movable metal line MLH overlaps the signal traces ST in a horizontal direction, whereas the movable metal line MLF (FIG. 9H) of the RF switch 900 (FIG. 9A) overlaps signal traces ST in a vertical direction.

Accordingly, the RF switches 900, 1000 may be contactless switches comprising a movable metal line MLF (or MLH) that is capacitively coupled to two signal traces ST (which are thereby coupled to each other), while a conductive rod CR provides a grounded isolation wall that electrically isolates a third signal trace ST from the two coupled signal traces ST. The conductive rod CR may preclude/block excitation of higher-order electromagnetic modes that may be present in switches having metal contacts and that may cause spurious (i.e., unwanted) coupling to the third (non-coupled) trace ST.

The contactless switches 900, 1000 may advantageously provide a durable solution (e.g., resulting in no visible wear after switching hundreds of times) that is also relatively mechanically simple. Accordingly, the RF switches 900, 1000 may have a lower cost and simpler assembly than switches that have metal contacts. Due to, for example, controlled spring compression of a switch body 910, the RF switch 900 may also have (i) very low sensitivity to vibration and (ii) low friction when switching. Due to the grounded isolation wall provided by the conductive rod CR, RF isolation of a signal trace ST of one of the transmission lines RF1-RF3 of the RF switch 900 (or the RF switch 1000) that is not coupled to a movable metal line MLF (or MLH) may be very high (e.g., greater than 50 dB). Moreover, the RF switches 900, 1000 may have very low RF variation with respect to mechanical tolerances and rotation uncertainty, and may provide low and stable PIM distortion by using capacitive coupling and no galvanic contacts.

Though the flowchart of FIG. 8 illustrates moving at least one contact MC of an RF switch 300 (FIG. 3), the operations of this flowchart may be applied to the RF switches 900, 1000 without moving any contacts, as the RF switches 900, 1000 may be contactless. Instead of moving contacts, movement (e.g., a 120-degree rotation) of the RF switch 900 (or the RF switch 1000) can contactlessly change which two of the transmission lines RF1-RF3 are coupled to each other while being electrically isolated from a third of the transmission lines RF1-RF3 by the conductive rod CR, which can improve RF isolation by providing a ground reference running through the middle of the RF switch 900 (or the RF switch 1000).

The present invention has been described above with reference to the accompanying drawings. The present invention is not limited to the illustrated embodiments. Rather, these embodiments are intended to fully and completely disclose the present invention to those skilled in this art. In the drawings, like numbers refer to like elements throughout. Thicknesses and dimensions of some components may be exaggerated for clarity.

Spatially relative terms, such as "under," "below," "lower," "over," "upper," "top," "bottom," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the example term "under" can encompass both an orientation of over and under. The device may be otherwise oriented (rotated 90 degrees or at other orientations) and the spatially relative descriptors used herein interpreted accordingly.

Herein, the terms "attached," "connected," "interconnected," "contacting," "mounted," "coupled," and the like can mean either direct or indirect attachment or coupling between elements, unless stated otherwise.

Well-known functions or constructions may not be described in detail for brevity and/or clarity. As used herein the expression "and/or" includes any and all combinations of one or more of the associated listed items.

The terminology used herein is for the purpose of describing particular embodiments only and is not intended to be limiting of the present invention. As used herein, the singular forms "a," "an," and "the" are intended to include the plural forms as well, unless the context clearly indicates otherwise. It will be further understood that the terms "comprises," "comprising," "includes," and/or "including" when used in this specification, specify the presence of stated features, operations, elements, and/or components, but do not preclude the presence or addition of one or more other features, operations, elements, components, and/or groups thereof.

That which is claimed is:

1. A radio frequency (RF) switch, comprising:
a first RF transmission line and a second RF transmission line that are capacitively coupled to each other;
a third RF transmission line having a signal trace that is electrically isolated from the first and second RF transmission lines; and
a conductive rod that is coupled to ground, the conductive rod defining a rotational axis of the RF switch,
wherein the RF switch is configured such that by rotating the RF switch around the conductive rod, any two of the first, second and third RF transmission lines are capacitively coupled to each other while leaving a remaining one of the first, second and third RF transmission lines electrically isolated from all other RF transmission lines, and
wherein the remaining one of the first, second and third RF transmission lines is electrically connected to ground.

2. The RF switch of claim 1, further comprising a movable metal line that is configured to provide the capacitive coupling between the first and second RF transmission lines.

3. The RF switch of claim 1, wherein the conductive rod is between a signal trace of the third RF transmission line and the first and second RF transmission lines.

4. The RF switch of claim 1, wherein the conductive rod protrudes from a surface of a conductive housing of a filter device.

5. A radio frequency (RF) switch, comprising:
a plurality of RF transmission lines including at least first, second, and third RF transmission lines; and
a movable metal line that is configured to move from a first position at which the movable metal line couples the first and second RF transmission lines to each other to a second position at which the movable metal line couples the second and third RF transmission lines to each other, wherein the movable metal line comprises first and second coupling sections that overlap the first and second RF transmission lines, respectively, when the movable metal line is at the first position, wherein the first and second coupling sections overlap the second and third RF transmission lines, respectively, when the movable metal line is at the second position, wherein a signal trace of the third RF transmission line is electrically isolated from all other of the plurality of RF transmission lines by electrically connecting the third RF transmission line to ground when the movable metal line is at the first position, and wherein a signal trace of the first RF transmission line is electrically isolated from all other of the plurality of RF transmission lines by electrically connecting the first RF transmission line to ground when the movable metal line is at the second position.

6. The RF switch of claim 5, wherein the first and second coupling sections of the movable metal line are configured to simultaneously move in a clockwise or counterclockwise direction.

7. The RF switch of claim 6, wherein the first and second coupling sections of the movable metal line are configured to revolve around a rotational axis of the RF switch.

8. The RF switch of claim 7, wherein each of the first, second, and third RF transmission lines is a stationary RF transmission line that does not revolve around the rotational axis of the RF switch.

9. The RF switch of claim 7, further comprising a conductive rod that is coupled to ground and that defines the rotational axis of the RF switch.

10. The RF switch of claim 9, further comprising a rotary plastic body that is configured to rotate around the conductive rod, wherein the rotary plastic body is contactless.

11. The RF switch of claim 10,
wherein the movable metal line is on a lower surface of the rotary plastic body, and
wherein the rotary plastic body overlaps each of the first, second, and third RF transmission lines.

12. The RF switch of claim 10, wherein the movable metal line is on a curved side surface of the rotary plastic body that faces a respective vertically-protruding portion of each of the first, second, and third RF transmission lines.

13. The RF switch of claim 9, wherein the conductive rod is spaced apart from the signal trace of the third RF transmission line, the signal trace of the first RF transmission line, and a signal trace of the second RF transmission line.

14. The RF switch of claim 5, wherein the RF switch is coupled to a filter device and is configured to switch between first and second filtering-response modes of the filter device by moving the movable metal line between the first position and the second position.

15. A radio frequency (RF) switch, comprising:
first, second, and third RF transmission lines;
a movable metal line that is configured to move from a first position at which the movable metal line couples the first and second RF transmission lines to each other to a second position at which the movable metal line couples the second and third RF transmission lines to each other;
a conductive rod that is coupled to ground and that defines a rotational axis of the RF switch; and
a rotary plastic body that is configured to rotate around the conductive rod,
wherein the movable metal line comprises first and second coupling sections that overlap the first and second RF transmission lines, respectively, when the movable metal line is at the first position,
wherein the first and second coupling sections overlap the second and third RF transmission lines, respectively, when the movable metal line is at the second position,
wherein the first and second coupling sections of the movable metal line are configured to simultaneously move in a clockwise or counterclockwise direction,
wherein the first and second coupling sections of the movable metal line are configured to revolve around the rotational axis of the RF switch,
wherein a signal trace of the third RF transmission line is electrically isolated from the first and second RF transmission lines when the movable metal line is at the first position,
wherein a signal trace of the first RF transmission line is electrically isolated from the second and third RF transmission lines when the movable metal line is at the second position, and
wherein the rotary plastic body is contactless.

* * * * *

UNITED STATES PATENT AND TRADEMARK OFFICE
CERTIFICATE OF CORRECTION

| | |
|---|---|
| PATENT NO. | : 11,990,663 B2 |
| APPLICATION NO. | : 17/583804 |
| DATED | : May 21, 2024 |
| INVENTOR(S) | : Sartorio et al. |

It is certified that error appears in the above-identified patent and that said Letters Patent is hereby corrected as shown below:

On the Title Page

Item [30], insert --Oct. 6 2021 (IT) . . . . . . . . . 102021000025433--

Signed and Sealed this
Seventeenth Day of September, 2024

Katherine Kelly Vidal
*Director of the United States Patent and Trademark Office*